US012113484B2

(12) United States Patent
Struble et al.

(10) Patent No.: US 12,113,484 B2
(45) Date of Patent: Oct. 8, 2024

(54) HIGH VOLTAGE STACKED TRANSISTOR AMPLIFIER

(71) Applicant: MACOM Technology Solutions Holdings, Inc., Lowell, MA (US)

(72) Inventors: Wayne Mack Struble, Franklin, MA (US); Shamit Som, Chelmsford, MA (US); Kohei Fujii, San Jose, CA (US); Walter Nagy, Lowell, MA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 337 days.

(21) Appl. No.: 17/219,118

(22) Filed: Mar. 31, 2021

(65) Prior Publication Data

US 2022/0321062 A1    Oct. 6, 2022

(51) Int. Cl.
*H03F 1/22*    (2006.01)
*H03F 3/195*    (2006.01)

(52) U.S. Cl.
CPC ............ *H03F 1/223* (2013.01); *H03F 3/195* (2013.01); *H03F 2200/451* (2013.01)

(58) Field of Classification Search
CPC ...................................... H03F 1/22
USPC ................................ 330/311, 310
See application file for complete search history.

(56) References Cited

U.S. PATENT DOCUMENTS

| | | | |
|---|---|---|---|
| 6,496,074 B1 | 12/2002 | Sowlati | |
| 8,008,977 B2 * | 8/2011 | Tserng | H03F 3/245 330/277 |
| 8,022,772 B2 * | 9/2011 | Cassia | H03F 3/211 330/311 |
| 8,031,005 B2 * | 10/2011 | Xiong | H03F 3/72 330/311 |
| 8,102,214 B2 * | 1/2012 | Park | H03F 1/342 330/311 |

(Continued)

FOREIGN PATENT DOCUMENTS

| | | |
|---|---|---|
| CN | 102931921 A | 2/2013 |
| EP | 2467935 B1 | 9/2014 |

OTHER PUBLICATIONS

International Search Report and Written Opinion for PCT/US2022/070774 dated Sep. 1, 2022.

(Continued)

*Primary Examiner* — Henry Choe
(74) *Attorney, Agent, or Firm* — Perilla Knox & Hildebrandt LLP; Jason M. Perilla

(57) ABSTRACT

Various aspects of integrated amplifiers, layouts for the integrated amplifiers, and packaged arrangements of the amplifiers are described. In one example, an amplifier includes an amplifier cell, and a biasing network coupled to the common gate transistor in the amplifier cell. The amplifier cell includes a common source transistor and a common gate transistor in a cascode arrangement, where at least one of the common source transistor and the common gate transistor comprises a field plate. Among other advantages, the amplifiers described herein can be biased with relatively high voltages and still operate like a single a common source transistor, without sacrificing reliability, performance, or requiring additional off-chip components, such as biasing networks of resistors and inductors.

38 Claims, 10 Drawing Sheets

(56) References Cited

U.S. PATENT DOCUMENTS

| | | | |
|---|---|---|---|
| 8,686,796 B2* | 4/2014 | Presti | H03F 1/223 |
| | | | 330/311 |
| 8,830,000 B2* | 9/2014 | Jeong | H03F 3/211 |
| | | | 330/311 |
| 9,035,697 B2* | 5/2015 | Youssef | H03F 1/3205 |
| | | | 330/311 |
| 2005/0051800 A1 | 3/2005 | Mishra et al. | |
| 2007/0046379 A1 | 3/2007 | Tanahashi et al. | |
| 2009/0212870 A1* | 8/2009 | Chen | H03F 1/223 |
| | | | 330/311 |

OTHER PUBLICATIONS

Kohei Fujii; "A DC to 22GHZ, 2W High Power Distributed Amplifier Using Stacked FET Topology with Gate Periphery Tapering" 2016 IEEE Radio Frequency Integrated Circuits Symposium; pp. 270-273.

Wu et al.; "A 2 to 18 GHz Compact High-Gain and High-Power GaN Amplifier" 2019 IEEE/MTT-S International Microwave Symposium pp. 710-713.

* cited by examiner

HIGH VOLTAGE STACKED TRANSISTOR AMPLIFIER

BACKGROUND

The semiconductor industry continues to see demands for integrated devices having lower cost and size, particularly for monolithic microwave integrated circuit (MIMIC) devices. MMIC devices encompass integrated circuits (IC) designed for operation over microwave frequencies. MIMIC devices can be relied upon for power amplification, mixing, and high-frequency switching, among other operations. The semiconductor industry also continues to see demands for higher voltage and higher power integrated devices, including high voltage and high power MMIC power amplifiers.

A common source amplifier is one of the basic single-stage field-effect transistor (FET) amplifier topologies. In a common source FET amplifier, an input signal is provided at the gate terminal of the FET amplifier, and an output signal is provided at the drain of the FET amplifier. The source terminal of the FET amplifier is not relied upon for either an input or an output terminal, and the source terminal is considered the "common" terminal. In bipolar junction transistors, the analogous circuit topology is typically referenced as a transconductance amplifier or a voltage amplifier.

SUMMARY OF THE INVENTION

Various aspects of integrated amplifiers, layouts for the integrated amplifiers, and packaged arrangements of the amplifiers are described. In one example, an amplifier includes an amplifier cell and a biasing network. The amplifier cell includes a common source transistor and a common gate transistor in a cascode arrangement, where at least one of the common source transistor and the common gate transistor includes a field plate. The biasing network is coupled to the common gate transistor in the amplifier cell. A drain of the common source transistor can also be electrically coupled to a source of the common gate transistor in the cascode arrangement. In some cases, the amplifier cell can also include a second common gate transistor, a third common gate transistor, or more common gate transistors. A stability capacitor can be coupled between an output for the amplifier and a gate of the common gate transistor in one aspect of the embodiments. A capacitance of the stability capacitor can maintain a positive real output impedance for the amplifier over an operating frequency for the amplifier.

In another aspect, a gate of the common gate transistor can be coupled to a biasing node of the biasing network. The biasing network can include a resistor voltage divider network coupled between an output for the amplifier, the amplifier cell, and a ground for the amplifier. A gate of the common gate transistor can be coupled to a biasing node along the resistor voltage divider network. The biasing network can include an inductor coupled in series with the resistor voltage divider network in another aspect of the embodiments. The biasing network can also include a supply transistor. A gate of the supply transistor can be coupled to a biasing node along the resistor voltage divider network, and a gate of the common gate transistor can be coupled to a source of the supply transistor.

In another aspect of the embodiments, the amplifier cell can also include a resistor-capacitor network coupled between a gate of the common gate transistor and a ground for the amplifier. The resistor-capacitor network can provide a radio-frequency ground at the gate of the common gate transistor. The amplifier can also include a stability resistor coupled between the amplifier cell and the biasing network in some cases.

The amplifier can also include a second amplifier cell. The second amplifier cell can include a second common source transistor and a second common gate transistor in a cascode arrangement. With respect to an output of the amplifier, the second amplifier cell can be arranged in parallel with the amplifier cell. The biasing network can be coupled to both the amplifier cell and the second amplifier cell, for biasing both the amplifier cell and the second amplifier cell. An output of the amplifier cell can be directly coupled to an output of the second amplifier cell.

A stability resistor can be coupled between an input of the amplifier cell and an input of the second amplifier cell. A stability resistor can be coupled between the amplifier cell and the biasing network. A first stability resistor can be coupled between the amplifier cell and the biasing network, and a second stability resistor can be coupled between the amplifier cell and the second amplifier cell.

The amplifier can also include a second biasing network, where a gate of the common gate transistor and a gate of the second common gate transistor are both coupled to the biasing network and the second biasing network. The amplifier can also include a bias interconnect feed line. The biasing network can be coupled at a first end of the bias interconnect feed line, and the second biasing network can be coupled at a second end of the bias interconnect feed line. The amplifier can also include a stability resistor coupled between the amplifier cell and the biasing network at the first end of the bias interconnect feed line, a second stability resistor coupled between the amplifier cell and the second amplifier cell along the bias interconnect feed line, and a third stability resistor coupled between the second amplifier cell and the second biasing network at the second end of the bias interconnect feed line.

A power handling capacity of the amplifier can be greater than 400 W in one example, and an operating supply voltage for the amplifier can be greater than 50V. The amplifier can operate under other power ranges and operating supply voltages.

In another example, an amplifier includes an amplifier cell, a stability capacitor coupled between an output for the amplifier and a gate of the second transistor, and a biasing network for the amplifier cell. The amplifier cell includes a first transistor and a second transistor. A capacitance of the stability capacitor can maintain a positive real output impedance for the amplifier over an operating frequency for the amplifier. The biasing network is coupled between the output and a gate for the second transistor in the amplifier. The first transistor can be a common source transistor, the second transistor can be a common gate transistor, and the first transistor and the second transistor can be coupled in a cascode arrangement. In another aspect, at least one of the first transistor and the second transistor includes a field plate.

The biasing network can include a resistor voltage divider network coupled between the output, the amplifier cell, and a ground for the amplifier. The biasing network can include a supply transistor. A gate of the supply transistor can be coupled to a biasing node along the resistor voltage divider network, and the gate of the second transistor can be coupled to a source of the supply transistor. The amplifier cell can also include a resistor-capacitor network coupled between the gate of the second transistor and a ground for the amplifier. The amplifier can also include a stability resistor coupled between the amplifier cell and the biasing network.

In another aspect of the embodiments, the amplifier can include a second amplifier cell. With respect to the output, the second amplifier cell can be arranged in parallel with the amplifier cell. The biasing network can be coupled to the amplifier cell and the second amplifier cell, for biasing both the amplifier cell and the second amplifier cell. The amplifier can also include a second biasing network. The biasing network and the second biasing network can be coupled to the amplifier cell and the second amplifier cell, for biasing both the amplifier cell and the second amplifier cell.

In another example, an integrated amplifier on a semiconductor die includes an amplifier cell. The amplifier cell includes a common source transistor and a common gate transistor in a cascode arrangement. The common gate transistor includes a plurality of contacts formed over the semiconductor die. The integrated amplifier also includes a stability capacitor coupled between an output for the integrated amplifier and a gate of the common gate transistor. The stability capacitor can be formed among the plurality of contacts of the common gate transistor over the semiconductor die.

In another aspect of the embodiments, the stability capacitor includes a plurality of stability capacitors distributed among the plurality of contacts of the common gate transistor. The stability capacitors can be distributed along an interconnect feed finger that extends between the plurality of contacts of the common gate transistor. The stability capacitor can include a number of stability capacitors, and the stability capacitors can be distributed along a number of interconnect feed fingers that extend between the contacts of the common gate transistor.

In another aspect of the embodiments, the common source transistor and the common gate transistor can be formed in a side-by-side arrangement over the semiconductor die. The common source transistor and the common gate transistor can be arranged side-by-side over the semiconductor die. The common source transistor and the common gate transistor can be arranged side-by-side over the semiconductor die with a bias interconnect feed line extending between the common source transistor and the common gate transistor.

The integrated amplifier can also include a biasing network for the amplifier cell, and a bias interconnect feed line coupled between the biasing network and the amplifier cell. The bias interconnect feed line can extend between and separate the common source transistor and the common gate transistor in the side-by-side arrangement over the semiconductor die.

The amplifier cell can also include a resistor-capacitor network for the common gate transistor. The resistor-capacitor network can be coupled between a gate of the common gate transistor and a ground for the integrated amplifier. A resistor of the resistor-capacitor network can be formed and coupled inline with the bias interconnect feed line. The resistor-capacitor network can be coupled from the gate of the common gate transistor to a source of the common source transistor through the bias interconnect feed line that extends between and separates the common source transistor and the common gate transistor. A capacitor of the resistor-capacitor network can be formed with a metal feature for a source of the common source transistor.

In another example, an integrated amplifier on a semiconductor die includes an amplifier cell, a biasing network for the amplifier cell, and a bias interconnect feed line coupled between the biasing network and the amplifier cell. The amplifier cell can include a first transistor in a side-by-side arrangement with a second transistor over the semiconductor die. The bias interconnect feed line can extend between and separate the first transistor and the second transistor over the semiconductor die.

The integrated amplifier can also include a stability capacitor coupled between an output for the integrated amplifier and a gate of the second transistor. The stability capacitor can be formed over the semiconductor die among a plurality of contacts of the second gate transistor. The stability capacitor can be distributed along an interconnect feed finger that extends between the plurality of contacts of the second transistor.

The amplifier cell can also include a resistor-capacitor network for the second transistor. The resistor-capacitor network can be coupled between a gate of the second transistor and a ground for the integrated amplifier. The resistor-capacitor network can be coupled from the gate of the second transistor to a source of the first transistor through the bias interconnect feed line that extends between and separates the first transistor and the second transistor. A resistor of the resistor-capacitor network can be formed and coupled inline with the bias interconnect feed line. A capacitor of the resistor-capacitor network can be formed with a metal feature for a source of the first transistor.

In another aspect of the embodiments, the integrated amplifier can also include a second amplifier cell. The second amplifier cell can include a third transistor arranged side-by-side with a fourth transistor over the semiconductor die. The bias interconnect feed line can extend between and separate the third transistor and the fourth transistor. The integrated amplifier can also include a separation resistor coupled between the amplifier cell and the second amplifier cell. The separation resistor can be formed and coupled inline with the bias interconnect feed line.

In another example, an integrated amplifier on a semiconductor die includes an amplifier cell and a biasing network for the amplifier cell. The biasing network includes two common drain transistors, two current source transistors, and a bias node between the two common drain transistors and the two current source transistors. The two common drain transistors can have different channel widths, and the two current source transistors can have different channel widths. The gates of the two common drain transistors can be coupled together. The gates of the two current source transistors can be coupled together.

In another aspect of the embodiments, the integrated amplifier can also include a resistor voltage divider network coupled between an output for the amplifier cell and gates of the two common drain transistors. The integrated amplifier can also include a capacitor coupled between gates of the two common drain transistors and the bias node.

In another example, a packaged amplifier device includes a device package comprising an input lead, an output lead, and a ground lead, a first integrated amplifier on a first semiconductor die secured within the device package, a second integrated amplifier on a second semiconductor die secured within the device package, and a bond wire coupled between the first semiconductor die and the second semiconductor die. An output of the first integrated amplifier being can be coupled in parallel with an output of the second integrated amplifier in the device package.

The packaged amplifier device can also include a third integrated amplifier on a third semiconductor die secured within the device package. An output of the third integrated amplifier can be coupled in parallel with the output of the first integrated amplifier and the output of the second integrated amplifier in the device package. The packaged amplifier device can also include a bond wire coupled between the second semiconductor die and the third semiconductor die. The packaged amplifier device can also include a third semiconductor die including a first capacitor, a fourth semiconductor die including a second capacitor, and a bond wire coupled between the third semiconductor die and the fourth semiconductor die.

In another aspect of the embodiments, a power handling capacity of the packaged amplifier device be greater than 2000 W, and an operating supply voltage for the amplifier can be greater than 50V. The packaged amplifier device can operate under other power ranges and operating supply voltages.

In another example, a packaged amplifier device includes a device package comprising package leads and an integrated amplifier on a semiconductor die. The package leads can consist of three package leads in one case. The semiconductor die can be secured within the device package. The integrated amplifier includes an amplifier cell. The amplifier cell includes a common source transistor and a common gate transistor in a cascode arrangement, and a biasing network for the amplifier cell. An output for the integrated amplifier can be coupled to an output lead among the three package leads, and an input for the integrated amplifier cam be coupled to an input lead among the three package leads.

In another aspect of the embodiments, the packaged amplifier device can also include a second integrated amplifier on a second semiconductor die secured within the device package. The output of the integrated amplifier can be coupled in parallel with an output of the second integrated amplifier in the device package, and a bond wire can be coupled between the semiconductor die and the second semiconductor die. The packaged amplifier device can also include a second semiconductor die. The second semiconductor die can include a capacitor and be coupled to the integrated amplifier within the device package. In another aspect of the embodiments, the output lead can include a conductive flange of the device package, the semiconductor can be secured to the conductive flange using solder, and the second semiconductor die can be secured to the conductive flange using epoxy.

In another example, a packaged amplifier device includes a device package comprising an input lead, an output lead, and a ground lead, a first integrated amplifier on a first semiconductor die secured within the device package, a first bond wire coupled between an output bond pad of the first integrated amplifier and the output lead, a second integrated amplifier on a second semiconductor die secured within the device package, a second bond wire coupled between an output bond pad of the second integrated amplifier and the output lead, such that an output of the first integrated amplifier is coupled in parallel with the output of the second integrated amplifier, and a third bond wire coupled between the first semiconductor die and the second semiconductor die.

The packaged amplifier device can also include a third semiconductor die including a capacitor, fourth bond wire coupled between the input lead and an input bond pad of the third semiconductor die, and a fifth bond wire coupled between an output bond pad of the third semiconductor die and an input bond pad of the input bond pad of the first integrated amplifier.

BRIEF DESCRIPTION OF THE DRAWINGS

Aspects of the present disclosure can be better understood with reference to the following drawings. It is noted that the elements in the drawings are not necessarily drawn to scale, with emphasis instead being placed upon illustrating the principles of the examples. In the drawings, like reference numerals designate like or corresponding, but not necessarily the same, elements throughout the several views.

DETAILED DESCRIPTION

Figure 1:
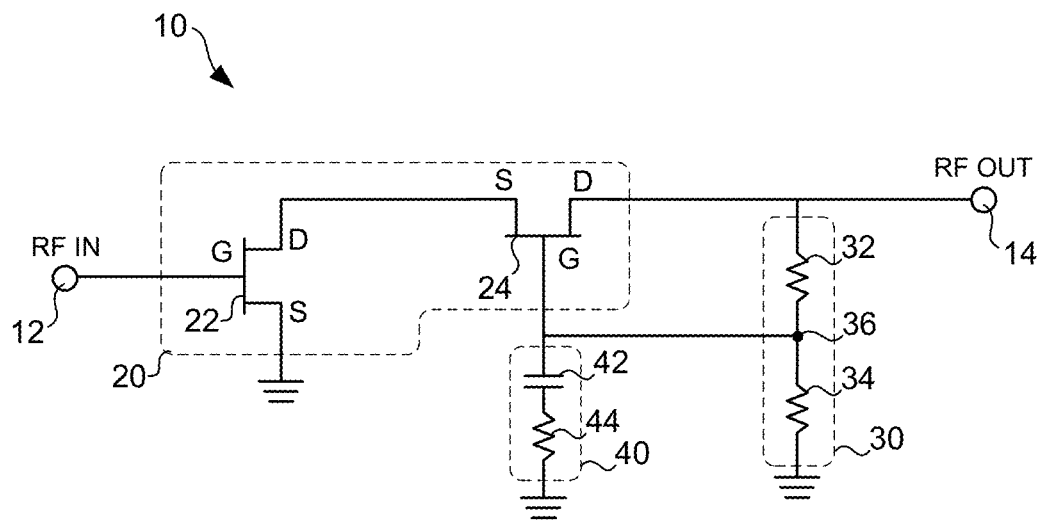
FIG. 1 illustrates an example amplifier stage according to various examples described herein.

For certain applications, there is a need to develop radio frequency (RF) semiconductor amplifier devices capable of operating with relatively high supply voltages. A higher supply voltage can be relied upon to achieve higher output power, higher gain, and higher efficiency, while also operating at higher load impedances. The use of higher load impedances also results in less matching losses at RF frequencies.

Operation of semiconductor amplifier devices at higher voltages can lead to lower reliability in some cases, however, due to higher peak field strengths and higher junction temperatures for the transistor amplifiers in the devices. One way to address these reliability issues is to use a transistor circuit topology in which the supply voltage is dropped across two, three, or more transistors. In this type of circuit topology, the direct current (DC) voltage split across each of the transistors does not exceed the maximum voltage rating of any of the individual transistors. This approach can effectively reduce the peak field strengths and junction temperatures among the transistors. The operating supply voltage can be doubled when using a cascode transistor circuit topology, for example, without increasing the peak field strengths or junction temperatures of the individual transistors.

In one transistor circuit topology approach, the transistor circuit would require only the connections for and behave like a simple common source transistor for simplicity. Such a circuit topology would include a gate terminal, a drain terminal, and a ground terminal, without additional terminals or connections for biasing the circuit or for other purposes. The transistor circuit topology would also be capable of operating at higher supply voltages without sacrificing reliability, performance, or requiring additional components, including off-chip components like biasing networks of resistors and inductors.

One challenge of using a circuit topology of several transistors to distribute voltage drops is maintaining stable operation. Among other approaches, stability resistors can be series-coupled with RF grounding capacitors on common gate transistors in a cascode transistor circuit topology. However, stability resistors and resistor-capacitor networks are not always sufficient to ensure stability in all cases. For circuits using transistors having field plates, for example, or having very small gate to drain capacitances, stability resistors and resistor-capacitor networks may not be sufficient to ensure stability across the full range of operating voltages and frequencies.

In the context outlined above, the embodiments described herein are directed to new transistor circuit topologies that can be stacked for high voltage amplifiers. Several new features and aspects of the embodiments are described at the circuit level, the device layout level, and the device packaging level. In one aspect, the amplifiers described herein can be biased with relatively high voltages and still operate like a single a common source transistor, without sacrificing reliability, performance, or requiring additional off-chip components.

The amplifiers described herein require only one input, one output, and one ground terminal, even when several stacked transistor circuits are arranged in parallel for higher power capacity. The stability of the integrated amplifier devices are improved by both on-chip and inter-chip features, within the packages of the devices. The packaged amplifier devices do not require additional external biasing or additional off-chip components. These and several other aspects of the embodiments are described in further detail below.

FIG. 1 illustrates an amplifier stage 10 according to various examples described herein. Like the other amplifier stages illustrated in FIGS. 2-7, the amplifier stage 10 is provided as a representative example of a high voltage transistor amplifier designed for stable operation at relatively high operating supply voltages. The illustration in FIG. 1 is not exhaustive, and the amplifier stage 10 can include other components that are not shown. Additionally, one or more components shown in FIG. 1 can be omitted in some cases. The amplifier stage 10 can be formed in various ways, such as using discrete components, as an integrated circuit device formed on one or more semiconductor die, or as a combination of discrete components and integrated circuit devices. The amplifier stage 10 can also be packaged in a suitable semiconductor package, with or without other components, as described in further detail below.

In one example, the transistors in the amplifier stage 10 (and the other transistors described herein) can be formed from group III-V elemental semiconductor materials, including the III-Nitrides (Aluminum (Al), Gallium (Ga), Indium (In), and their alloys (AlGaIn) based Nitrides), Gallium Arsenide (GaAs), Indium Phosphide (InP), Indium Gallium Phosphide (InGaP), Aluminum Gallium Arsenide (AlGaAs), and compounds thereof. In other cases, the transistors in the amplifier stage 10 can be formed from group IV elemental semiconductor materials, including Silicon (Si), Germanium (Ge), and compounds thereof. When embodied as an integrated device, the amplifier stage 10 can be formed using any suitable sequence of steps in a semiconductor manufacturing process.

As shown in FIG. 1, the amplifier stage 10 includes an input 12, an output 14, an amplifier cell 20, a biasing network 30, and a stabilization network 40. The amplifier cell 20 includes a common source transistor 22 and a common gate transistor 24. The common source transistor 22 and a common gate transistor 24 are coupled in a cascode arrangement. The biasing network 30 includes resistors 32 and 34 arranged in a series-connected voltage divider, and the stabilization network 40 includes a capacitor 42 and a resistor 44.

The gate terminal of the transistor 22 is coupled to the input 12, the source terminal of the transistor 22 is coupled to ground for the amplifier stage 10, and the drain terminal of the transistor 22 is coupled to the source of the transistor 24. The drain of the transistor 24 is coupled to the output 14, and the gate of the transistor 24 is coupled to ground through the stabilization network 40. The biasing network 30 is coupled between the output 14, the amplifier cell 20, and ground for the amplifier stage 10. The gate of the transistor 24 is coupled to the bias node 36 of the biasing network 30, which is between the resistors 32 and 34.

The transistors 22 and 24 can be embodied as enhancement-mode field-effect transistors (FETs), although other types of transistors can be relied upon. Thus, when the gate of the transistor 22 is grounded, the transistor 22 (and the amplifier stage 10) is designed to draw no (or substantially no) current, as the potential at the gate of the transistor 22 is below the pinch-off voltage. In one example, the transistors 22 and 24 can be embodied as group III-V semiconductor FET devices of any suitable size (e.g., gate width), although the concepts described herein can be applied to transistors formed from other semiconductor materials.

The transistor 22 can include one or more field plates, such as source-connected field plates, gate-connected field plates, or both source-connected field plates and gate-connected field plates. Similarly, the transistor 24 can include source-connected field plates, gate-connected field plates, or both source-connected field plates and gate-connected field plates. In other cases, the transistors 22 and 24 do not include field plates. The transistors 22 and 24 can be matched (or substantially matched) in size and power handling capacity in one example, although the transistors 22 and 24 can vary in size as compared to each other. Other aspects of the transistors 22 and 24 are described in additional detail below.

In operation, an operating supply voltage can be applied to the output 14 of the amplifier stage 10, and an RF input signal can be applied to the input 12 of the amplifier stage 10. In this condition, the amplifier cell 20 amplifies the RF input signal received at the input 12 and provides an amplified output signal at the output 14. The operating supply voltage of the amplifier stage 10 can be relatively high, such as between 50-150V, or higher, although lower potentials can be used in some cases. As particular examples, the operating supply voltage of the amplifier stage 10 can be 80V, 90V, 100V, 110V, 120V, 130V, or higher. The total power handling capacity of the amplifier stage 10 can vary based on the sizes of the transistors 22 and 24, among other factors. The power handling capacity of the amplifier stage 10 can vary based on the size of the transistors 22 and 24, among other factors. With larger transistors 22 and 24, the power handling capacity of the amplifier stage 10 can be larger. Several stages similar to the amplifier stage 10 can also be stacked together and coupled in parallel.

During operation of the amplifier stage 10, the biasing network 30 divides the operating supply voltage across the transistors 22 and 24. The values of the resistors 32 and 34 can be selected such that the voltage at the source of the transistor 24 is substantially equal to half of the operating supply voltage applied to the output 14. That is, when the transistor 22 is turned off (i.e., when the gate voltage of the transistor 22 is less than the pinch-off voltage for the transistor 22), the biasing network 30 substantially divides the full operating supply voltage of the amplifier stage 10 equally (or substantially equally) across the transistors 22 and 24. The biasing network 30 helps to maintain the drain-to-source voltages of the transistors 22 and 24 to within the maximum voltage ratings for those devices, even at relatively high operating supply voltages for the amplifier stage 10.

In one example, the resistances of the resistors 32 and 34 can be the same as or similar to each other, although the respective resistances of the resistors 32 and 34 can vary as compared to each other. The resistors 32 and 34 can be relatively high impedances, such as resistances in the kiloohm or several kiloohm range. The use of high impedances for the resistors 32 and 34 can avoid power dissipation and improve the overall efficiency of the amplifier stage 10. If there is a need to source more current for biasing the amplifier cell 20, however, the resistances of the resistors 32 and 34 can be lower. When the amplifier stage 10 is formed as an integrated device, the resistors 32 and 34 can also be integrated on the same semiconductor die with the transistors 22 and 24, so that no external biasing components or other off-chip components are needed.

One concern for stable operation of the amplifier stage 10 is how the output impedance of the amplifier stage 10 (i.e., looking into the output 14) varies over the operating range of the amplifier stage 10. The operating supply voltage and the operating frequency of the amplifier stage 10 are two operating factors that impact the stability of the amplifier stage 10, among others. Further, the transistors 22 and 24 can include source field plates in some cases. Transistors including source field plates can exhibit decreasing intrinsic drain-to-gate capacitance at higher operating voltages. Thus, the transistor 24 can exhibit lower intrinsic drain-to-gate capacitance at higher operating supply voltages. This condition can, in some operating conditions, present a negative real output impedance at the output 14, and cause the transistor 24 to become unstable. In testing with RF input signals from 500 MHz to 50 GHz, the amplifier stage 10 was shown to exhibit increasing negative real output impedance with increasing operating supply voltages, particularly at higher operating supply voltages and operating frequencies.

The stabilization network 40 can help to avoid unstable operation of the amplifier stage 10. The stabilization network 40 includes a resistor-capacitor network coupled between the gate of the transistor 24 and ground for the amplifier stage 10. In the example shown in FIG. 1, the stabilization network 40 includes the capacitor 42 and the resistor 44 coupled in series. The capacitor 42 and the resistor 44 can be varied as compared to the arrangement shown in FIG. 1. For example, the resistor 44 can be directly coupled to the gate of the transistor 24, and the capacitor 42 can be coupled between the resistor 44 and ground for the amplifier stage 10. The stabilization network 40 can include other resistor and capacitor networks in some cases.

The capacitor 42 can be relied upon to increase the stability of the amplifier stage 10 over the operating conditions of the amplifier stage 10. The resistor 44 can also be relied upon to increase the stability of the amplifier stage 10 over the operating frequency range of the amplifier stage 10. The capacitance of the capacitor 42 can be selected at values between 0.2 pF/mm and 0.10 pF/mm, for example, although other capacitances can be used. In one case, the capacitance of the capacitor 42 was selected at 0.6 pF for testing the operation of the amplifier stage 10. The resistance of the resistor 44 can be selected at values between 1 Ω-mm and 200 Ω-mm, for example, although other resistances can be used.

Across an operating frequency range from 500 MHz to 50 GHz and an operating supply voltage range from 25V to greater than 100V, the resistance of the resistor 44 was varied from 10Ω to 100Ω. The amplifier stage 10 was shown to exhibit increased stability at higher values of the resistor 44. The performance of the amplifier stage 10 is suitable for amplification of a wide range of input frequencies over a wide range of operating supply voltages, with good output impedance at the output 14. However, the amplifier stage 10 may still exhibit a negative real output impedance in some cases, particularly at higher operating frequencies and supply voltages, even at higher values of the resistor 44.

Figure 2:
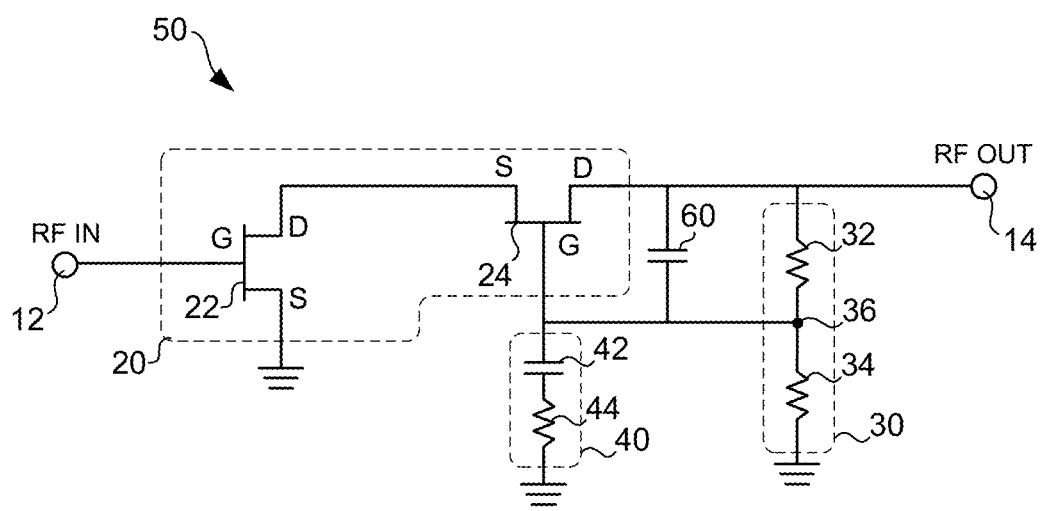
FIG. 2 illustrates another example amplifier stage with a stability capacitor according to various examples described herein.

Turning to other aspects, FIG. 2 illustrates an amplifier stage 50 with an additional stability capacitor 60. The amplifier stage 50 shown in FIG. 2 is similar to the amplifier stage 10 shown in FIG. 1, but also includes the stability capacitor 60. The stability capacitor 60 can be relied upon to address the decrease in the intrinsic drain-to-gate capacitance of transistors having field plates at higher operating voltages. The stability capacitor 60 is coupled between the drain and the gate of the transistor 24. The capacitance of the capacitor 60 can be selected at values between 0.01 pF/mm and 0.5 pF/mm, for example, although other capacitances can be used. The capacitance of the capacitor 60 can be selected based on the operating supply voltage for the amplifier stage 10, the size of the transistor 24, the type and size of any field plates used in the transistor 24 (if any), and other factors. In one case, the capacitance of the capacitor 60 was selected at 0.25 pF for testing the operation of the amplifier stage 50.

Across an operating frequency range from 500 MHz to 50 GHz and an operating supply voltage range of 100V and greater, the performance of the amplifier stage 50 is suitable for amplification of a wide range of input frequencies over a wide range of operating supply voltages, with good output impedance at the output 14. With the capacitor 60 selected at 0.25 pF, the amplifier stage 50 exhibited only a positive real output impedance even at relatively high operating frequencies and supply voltages (including at 50 GHz and 100V).

Other aspects of the embodiments include variations on the biasing network 30 shown in FIGS. 1 and 2. The series-connected voltage divider provided by the resistors 32 and 34 in the biasing network 30 can have limitations in some operating states. For example, as the operating supply voltage is increased, the biasing network 30 will draw more current, reducing efficiency. The RF impedance of the biasing network 30 also loads the transistor 24. One approach to address these concerns is shown in FIG. 3.

Figure 3:
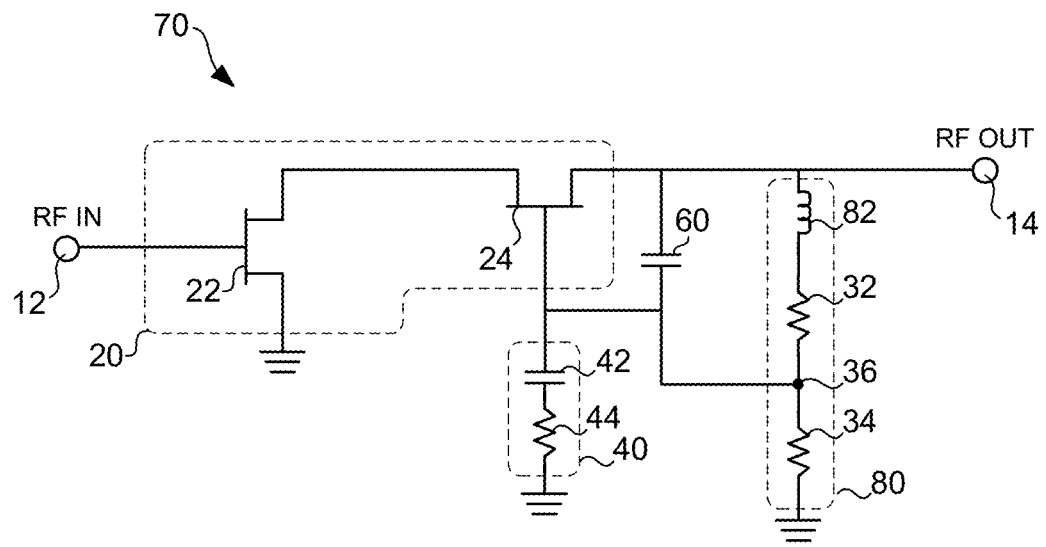
FIG. 3 illustrates another example amplifier stage with a biasing network including a choke coil according to various examples described herein.

FIG. 3 illustrates an amplifier stage 70 with a biasing network 80 including a choke coil 82. The amplifier stage 70 shown in FIG. 3 is similar to the amplifier stage 50 shown in FIG. 2, but also includes the choke coil 82 as a component of the biasing network 80. The choke coil 82 can be relied upon to give the biasing network 80 a larger RF impedance as compared to the biasing network 30. The resistances of the resistors 32 and 34 can also be increased, together, to give the biasing network 80 a larger DC impedance. The performance of the amplifier stage 70 is suitable for amplification of a wide range of input frequencies over a wide range of operating supply voltages, and particularly at higher operating supply voltages, with relatively higher efficiency.

The amplifier stage 70 can also have limitations for certain applications and operating conditions, however. For example, the choke coil 82 is an extra component, and it can limit the overall bandwidth of the amplifier stage 70. It might also be necessary to implement the choke coil 82 as an off-chip component, which may be undesirable for certain applications. It can also be difficult for the biasing network 80 to supply sufficient forward gate current to the transistor 24 under high RF drive, as higher resistances are chosen for the resistors 32 and 34. One approach to address these concerns is shown in FIG. 4.

Figure 4:
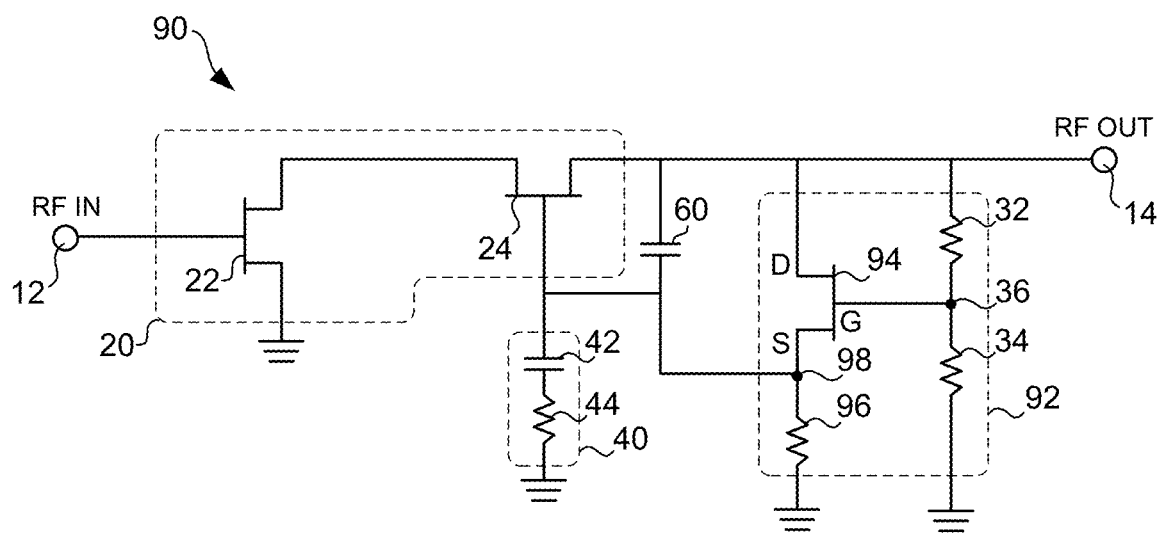
FIG. 4 illustrates another example amplifier stage with a biasing network including a bias supply transistor according to various examples described herein.

FIG. 4 illustrates an amplifier stage 90 with a biasing network 92 including a bias supply transistor 94. The amplifier stage 90 shown in FIG. 4 is similar to the amplifier stage 50 shown in FIG. 2, but the biasing network 92 offers certain improvements as compared to the biasing network 30 and the biasing network 80, particularly at higher operating supply voltages and RF drive. As shown in FIG. 4, the drain of the bias supply transistor 94 is coupled to the output 14. The source of the transistor 94 is coupled to the resistor 96, which is coupled to ground for the amplifier stage 90. The gate of the transistor 94 is coupled to the bias node 36 between the resistors 32 and 34. Further, rather than being coupled to the bias node 36, the gate of the transistor 24 is coupled to the bias node 98 at the source of the transistor 94.

The transistor 94 can be embodied as a FET transistor formed using the same semiconductor materials and manufacturing steps used to form the transistors 22 and 24. However, the transistor 94 can be significantly smaller in dimensions (e.g., channel width) than the transistors 22 and 24, because it is not relied upon as an amplifier. For example, the transistor 94 can be between about 40-80 times smaller than the transistors 22 and 24.

The transistor 94 presents both a high RF impedance and a high DC impedance at the output 14. At the same time, the transistor 94 can efficiently source current to the transistor 24, even at high operating supply voltages and under high RF drive. Higher resistances can also be selected for the resistors 32 and 34 without negatively impacting the ability of the transistor 94 to source drive current to the transistor 24. As an example, the resistors 32 and 34 can be selected in the range of hundreds of kiloohms.

Figure 5:
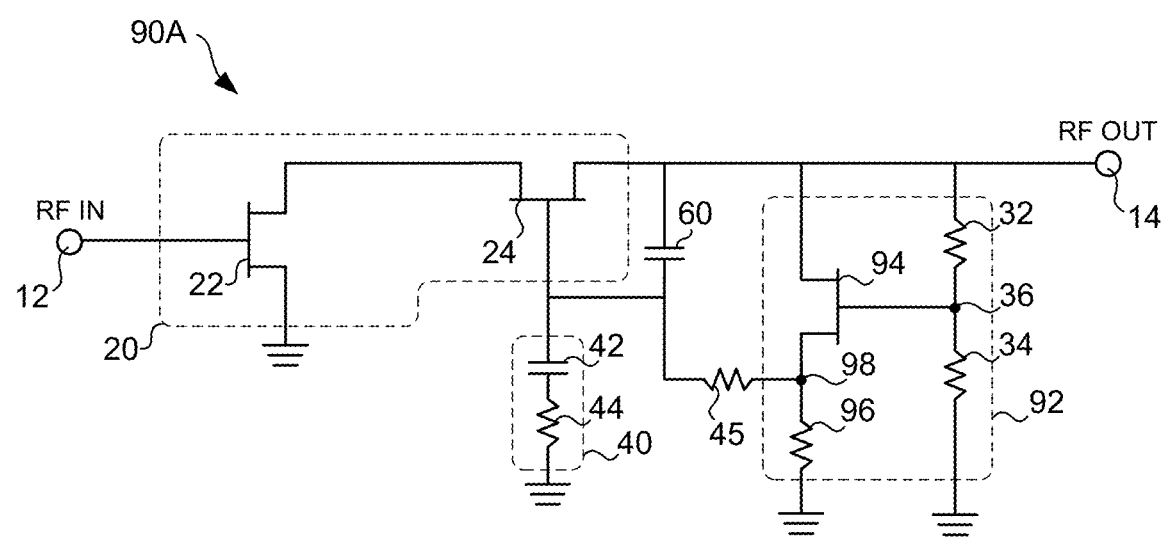
FIG. 5 illustrates another example amplifier stage with a bias stabilization resistor according to various examples described herein.

FIG. 5 illustrates another example amplifier stage 90A, including a bias stabilization resistor 45. The amplifier stage 90A is similar to the amplifier stage 90 shown in FIG. 4, but also includes the bias stabilization resistor 45. The bias stabilization resistor 45 is coupled between the bias node 98 at the source of the bias supply transistor 94 and the gate of the transistor 24.

Figure 6:
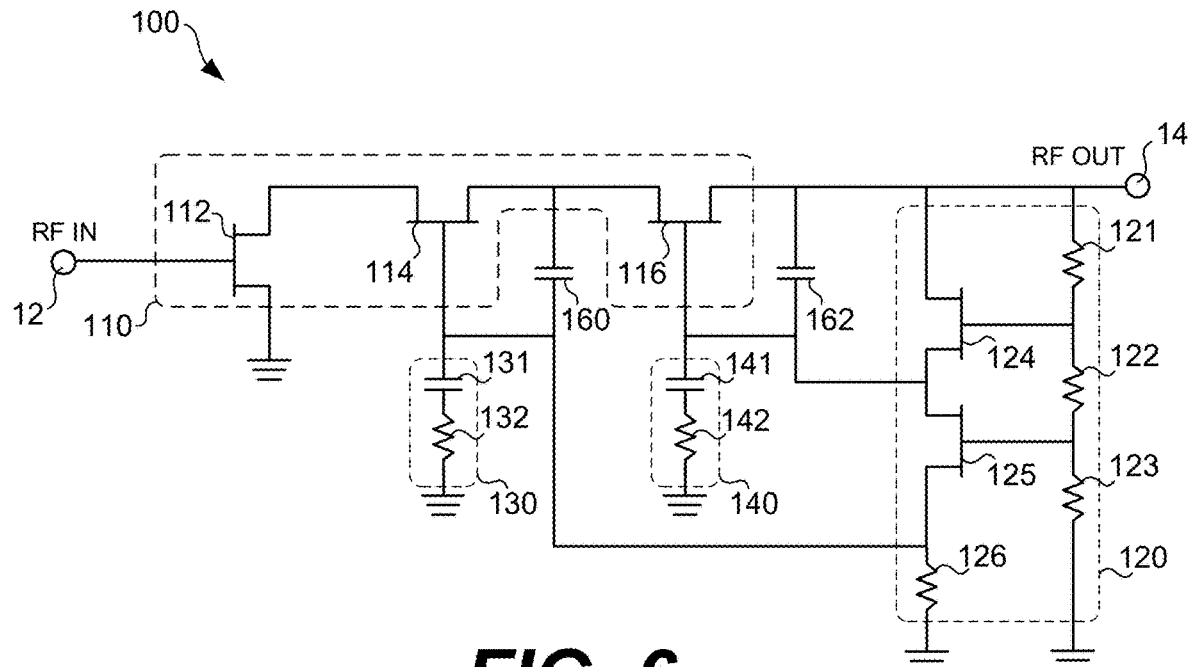
FIG. 6 illustrates another example amplifier stage with additional transistor stages according to various examples described herein.

The concepts described above can be extended to use with even higher operating supply voltages. FIG. 6 illustrates an amplifier stage 100 with additional transistor stages for use with even higher operating supply voltages. The amplifier stage 100 includes an input 12, an output 14, an amplifier cell 110, a biasing network 120, a first stabilization network 130, a second stabilization network 140, a first stability capacitor 160, and a second stability capacitor 162.

The amplifier cell 110 includes a common source transistor 112, a first common gate transistor 114, and a second common gate transistor 116 in a cascode arrangement. The biasing network 120 includes resistors 121-123 arranged in a series-connected voltage divider, a first bias supply transistor 124, a second bias supply transistor 125, and a resistor 126. The first stabilization network 130 includes a capacitor 131 and a resistor 132, and the second stabilization network 140 includes a capacitor 141 and a resistor 142.

The gate terminal of the transistor 112 is coupled to the input 12, the source terminal of the transistor 112 is coupled to ground for the amplifier stage 100, and the drain terminal of the transistor 112 is coupled to the source of the transistor 114. The drain of the transistor 114 is coupled to the source of the transistor 116, and the gate of the transistor 114 is coupled to ground through the first stabilization network 130. The drain of the transistor 116 is coupled to the output 14, and the gate of the transistor 116 is coupled to ground through the second stabilization network 140. The biasing network 120 is coupled between the output 14, the amplifier cell 110, and ground for the amplifier stage 100. For biasing, the gate of the transistor 116 is coupled to a bias node at the source of the transistor 124 in the biasing network 30, and the gate of the transistor 114 is coupled to a bias node at the source of the transistor 125 in the biasing network 30.

The transistors 112, 114, and 116 can be embodied as enhancement-mode FETs for use as high efficiency power amplifiers, although other types of transistors can be relied upon. Thus, when the gate of the transistor 112 is grounded, the transistor 112 (and the amplifier stage 100) is designed to draw no (or substantially no) current, as the potential at the gate of the transistor 112 is below the pinch-off voltage. The transistors 112, 114, and 116 can be embodied as group III-V semiconductor FET devices of any suitable size (e.g., gate width), although the concepts described herein can be applied to transistors formed from other semiconductor materials.

The transistors 112, 114, and 116 can include one or more field plates, such as source-connected field plates, gate-connected field plates, or both source-connected field plates and gate-connected field plates. In other cases, the transistors 112, 114, and 116 do not include field plates. The transistors 112, 114, and 116 can be matched (or substantially matched) in size and power handling capacity in one example, although the transistors 112, 114, and 116 can vary in size as compared to each other. The transistors 112, 114, and 116 can vary in size as compared to those in the amplifier cell 20 shown in FIGS. 1-4. In some cases, the combined size of the transistors 112, 114, and 116 can be larger than the combined size of the transistors 22 and 24. In other cases, the combined size of the transistors 112, 114, and 116 can be smaller than the combined size of the transistors 22 and 24. Overall, the amplifier stage 100 can be designed for use with higher operating supply voltages, as the operating supply voltage applied at the output 14 can be divided across the transistors 112, 114, and 116.

In operation, an operating supply voltage can be applied to the output 14 of the amplifier stage 100, and an RF input signal can be applied to the input 12 of the amplifier stage 100. In this condition, the amplifier stage 100 amplifies the RF input signal received at the input 12 and provides an amplified output signal at the output 14. The operating supply voltage of the amplifier stage 100 can be higher than that for the amplifier stage 10, because the amplifier stage 100 includes more transistors than the amplifier cell 20. For example, the operating supply voltage of the amplifier stage 10 can be 100-150V or higher, but the amplifier stage 100 is not limited to use over any particular range of voltage. As particular examples, the operating supply voltage of the amplifier stage 10 can be 100V, 110V, 120V, 130V, 140V, 150V, or higher. In some cases, the gain and total power handling capacity of the amplifier stage 100 can be higher than that for the amplifier stage 10. The amplifier stage 100 can also be connected in parallel with one, two, three, four, or more amplifier stages of the same (or similar design), to further increase the power handling capacity.

During operation of the amplifier stage 100, the biasing network 120 divides the operating supply voltage across the transistors 112, 114, and 116. The values of the resistors 121, 122, and 123 can be selected such that the voltage at the source of the transistor 116 is substantially equal to two thirds (⅔) the operating supply voltage applied to the output 14. The resistors 121, 122, and 123 can also be selected such that the voltage at the source of the transistor 114 is substantially equal to one third (⅓) the operating supply voltage applied to the output 14. In one example, the resistances of the resistors 121, 122, and 123 can be the same as or similar to each other, although the respective resistances of the resistors 121, 122, and 123 can vary as compared to each other. The resistors 121, 122, and 123 can be relatively high impedances, such as resistances in the hundreds of kiloohm range. The use of high impedances for the resistors 121, 122, and 123 can avoid power dissipation and improve the overall efficiency of the amplifier stage 100.

In the amplifier stage 100, the stability capacitors 160 and 162 can be relied upon to address the decrease in the intrinsic drain-to-gate capacitance of transistors having field plates at higher operating voltages. The first stability capacitor 160 is coupled between the source of the transistor 116 and the gate of the transistor 114. The second stability capacitor 162 is coupled between the drain and the gate of the transistor 116. The capacitances of the stability capacitors 160 and 162 can be selected based on the operating supply voltage for the amplifier stage 100, the size of the transistors 114 and 116, the type and size of any field plates used in the transistors 114 and 116 (if any), and other factors.

Figure 7:
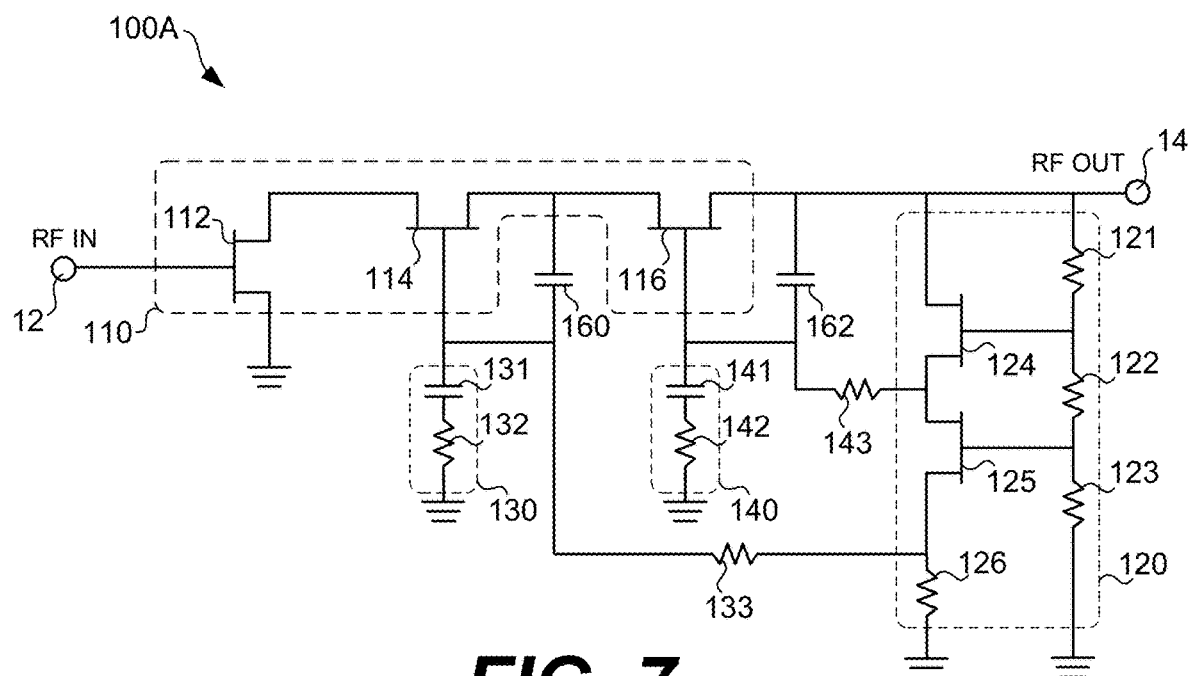
FIG. 7 illustrates another example amplifier stage with bias stabilization resistors according to various examples described herein.

FIG. 7 illustrates another example amplifier stage 100A, including a first bias stabilization resistor 133 and a second bias stabilization resistor 143. The amplifier stage 100A is similar to the amplifier stage 100 shown in FIG. 6, but also includes the resistors 133 and 143. The first bias stabilization resistor 133 is coupled between the source of the second bias supply transistor 125 and the gate of the transistor 114. The second bias stabilization resistor 143 is coupled between the source of the first bias supply transistor 124 and the gate of the transistor 116.

Figure 8:
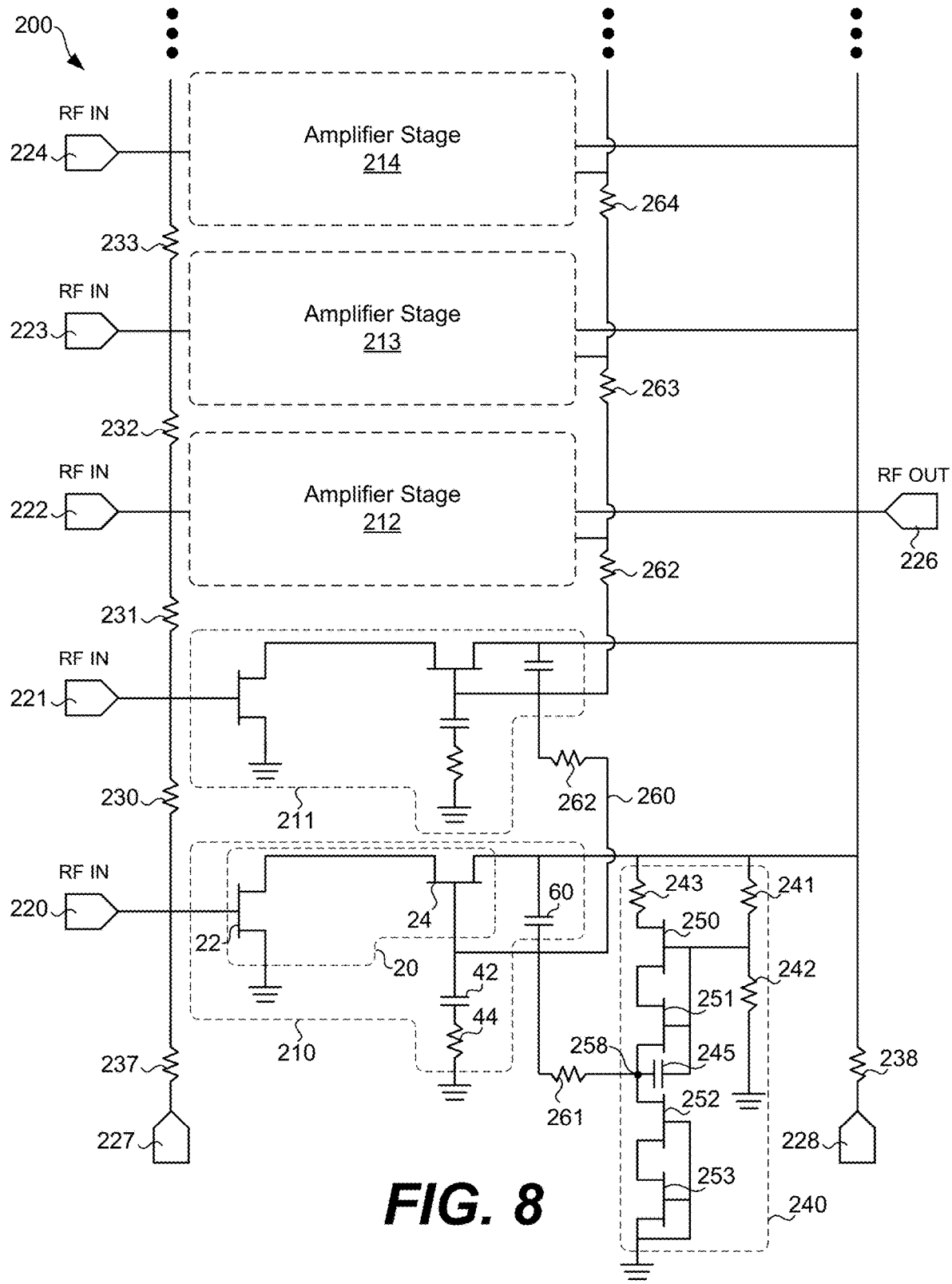
FIG. 8 illustrates an example stacked amplifier according to various examples described herein.

FIG. 8 illustrates an example stacked amplifier 200 according to various examples described herein. The stacked amplifier 200 is provided as a representative example of a high voltage stacked transistor amplifier designed for stable operation at relatively high operating supply voltages and power capacity. The illustration in FIG. 8 is not exhaustive, and the stacked amplifier 200 can include other components that are not illustrated in FIG. 8. Additionally, one or more components shown in FIG. 8 can be omitted in some cases. The stacked amplifier 200 can be formed in various ways, such as using discrete components, as an integrated circuit device formed on one or more substrates, or as a combination of discrete components and integrated circuit devices. In a preferred embodiment, the stacked amplifier 200 is formed and integrated on a single semiconductor die. The stacked amplifier 200 can also be packaged in a suitable semiconductor device package, with or without other components, as described in further detail below.

Figure 9:
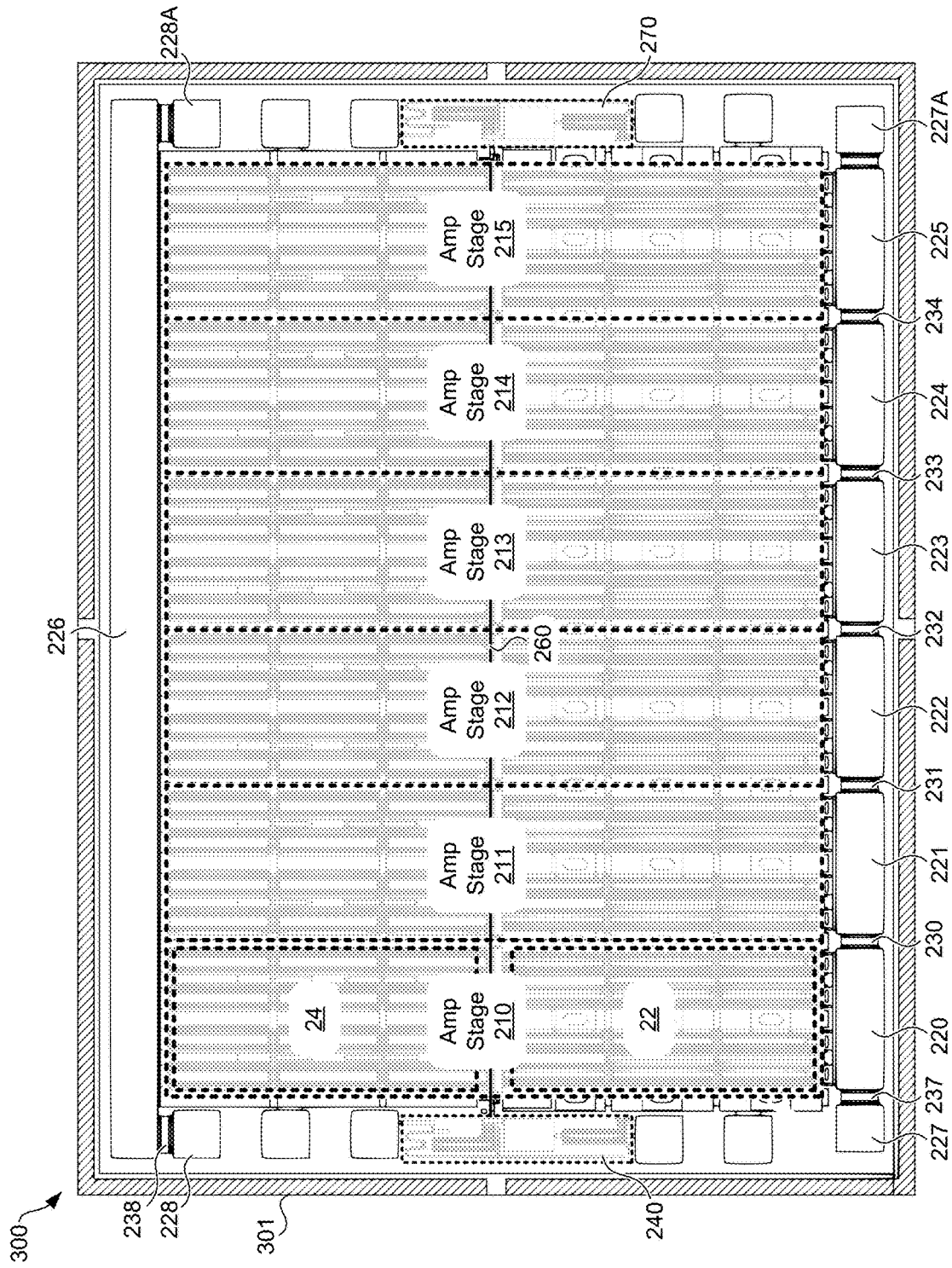
FIG. 9 illustrates an example semiconductor die layout for a stacked amplifier according to various examples described herein.

The stacked amplifier 200 includes amplifier stages 210-214, among possibly others, arranged in a parallel configuration between the inputs and the output of the stacked amplifier 200. Each of the amplifier stages 210-214 is similar to the amplifier stage 90A shown in FIG. 5. In other cases, the stacked amplifier 200 can be formed using the amplifier stages 10, 50, 70, 90, 100, or 100A. Although five amplifier stages 210-214 are shown in FIG. 8, the stacked amplifier 200 is not limited to any particular number of amplifier stages. In other cases, the stacked amplifier 200 can include six, seven, eight, or more amplifier stages in a stacked, parallel arrangement, and FIG. 9 illustrates an example layout of six amplifier stages. Alternatively, the stacked amplifier 200 can include less than five amplifier stages, and one or more of the amplifier stages 210-214 can be omitted.

The stacked amplifier 200 also includes a number of inputs 220-224, among possibly others, coupled respectively to the inputs of the amplifier stages 210-214. Separation resistors 230-233 are coupled between the inputs 220-224 as shown in FIG. 8, to stabilize the operations (and potentials) of the amplifier stages 210-214 with respect to each other. The separation resistors 230-233 can be relatively small resistances, such as in the range of less than 100, 50, or 10Ω, although any suitable resistances can be used.

The stacked amplifier 200 also includes an output 226, and the outputs of the amplifier stages 210-214 are all coupled to the output 226. The stacked amplifier 200 also includes stitch pads 227 and 228 and stitch resistors 237 and 238. The stitch pads 227 and 228 can be used to electrically couple the stacked amplifier 200 to another stacked amplifier, in parallel, as described detail below. The stitch resistors 237 and 238 are similar to the separation resistors 230-233. As described with reference to FIG. 8 below, the inputs 220-224 can be embodied as bond pads for landing bond wires for electrical connections. The output 226 and the stitch pads 227 and 228 can also be embodied as bond pads for landing bond wires.

The stacked amplifier 200 also includes a biasing network 240. The biasing network 240 provides a bias voltage on the bias node 258, which is coupled along the bias interconnect feed line 260 to each of the amplifier stages 211-214 through the separation resistors 261-264. Thus, the biasing network 240 provides a bias voltage to the transistor 24 in the amplifier stage 210, and the biasing network 240 also provides the bias voltage to the transistors in each of the amplifier stages 211-214, among possibly others. In some cases, the stacked amplifier 200 can include two or more biasing networks similar to the biasing network 240. Referring to FIG. 8, for example, the stacked amplifier 200 can include an additional biasing network above the amplifier 214 (e.g., at the top of the page), and the additional biasing network can also be coupled to the bias interconnect feed line 260.

The biasing network 240 includes resistors 241 and 242 arranged in a voltage divider, a resistor 243, transistors 250-253, and a capacitor 245. The source of the transistor 250 is coupled through the resistor 243 to the output 226. The drain of the transistor 250 is coupled to the source of the transistor 251, and the drain of the transistor 251 is coupled to the bias node 258 and the source of the transistor 252. The drain of the transistor 252 is coupled to the source of the transistor 253, and the drain of the transistor 253 is coupled to ground for the stacked amplifier 200. The gates of the transistors 250 and 251 are both coupled to the capacitor 245, which is also coupled to the bias node 258. The gates of the transistors 252 and 253 are both coupled to ground for the stacked amplifier 200.

Similar to other biasing networks described herein, the biasing network 240 is designed such that the voltage at the source at the transistor 24 is half of the operating supply voltage applied to the output 226 when the transistor 22 is turned off. The values of the resistors 241-243 can be selected to achieve the correct bias voltage at the bias node 258 for that equal (or substantially equal) voltage biasing between the transistors 22 and 24. Thus, when the transistor 22 is turned off (i.e., when the gate voltage of the transistor 22 is less than the pinch-off voltage for the transistor 22), the biasing network 240 substantially divides the full operating supply voltage equally across the transistors 22 and 24. Additionally, the capacitor 245 provides a low RF impedance at the gate-to-source junction of transistor 251. The capacitor 245 prevents forward conduction of the transistors 250 and 251 under RF voltage swings at the output of the amplifier stage 210. Thus, the capacitor 245 helps to maintain a constant DC voltage at node 258, over a range of RF input and output power for the amplifier stage 210.

The biasing network 240 is designed in particular for stability and efficiency when used with higher operating supply voltages, such as operating supply voltages between about 80V-150V, or greater. With higher operating supply voltages, the junction temperatures of the transistors 250-253 can become a concern, and the transistors 250-253 are designed to account for and avoid damaging junction temperatures.

The transistors 250 and 251 are connected as common drain or source followers, and the transistors 252 and 253 are connected as current sources. During operation, the current flowing through the transistor 250 is the same as the current flowing through the transistor 251, and current flowing through the transistor 252 is the same as the current flowing through the transistor 253. Also, close to half of the total operating supply voltage applied at the output 226 is dropped across the transistors 250 and 251, and close to half of the voltage is dropped across the transistors 252 and 253.

However, the voltage drop among the transistors 250 and 251 is not necessarily the same. In one design, the voltage drop across the transistor 250 is higher than the voltage drop across the transistor 251, because the drain-to-source voltage across the transistor 251 is approximately the pinch-off voltage of the transistor 251. The bulk (and balance) of the voltage across the pair of the transistors 250 and 251 is dropped across the transistor 250. Similarly, the voltage drop among the transistors 252 and 253 is not necessarily the same. The voltage drop across the transistor 252 is higher than the voltage drop across the transistor 253, because the drain-to-source voltage across the transistor 253 is approximately the pinch-off voltage of the transistor 253. The bulk (and balance) of the voltage across the pair of the transistors 252 and 253 is dropped across the transistor 252. Thus, the transistors 250 and 252 handle more power than the transistors 251 and 253, and the junction temperatures of the transistors 250 and 252 are of a larger concern.

To account for the operational concern identified above, the size of the transistor 250 (e.g., in total gate width) can be larger than the size of the transistor 251, and the size of the transistor 252 can be larger than the size of the transistor 253. Thus, the current density in the transistor 251 can be larger than the current density in the transistor 250, and the current density in the transistor 253 can be larger than the current density in the transistor 252. The junction temperatures of the transistors 250-253 are still maintained to within suitable operating parameters, because the total power handling of each of the transistors 250-253 is balanced, respectively, with its size. Additional aspects of the transistors 250-253 and the biasing network 240 are described below with reference to FIG. 11.

In operation, an operating supply voltage can be applied to the output 226 of the stacked amplifier 200, and the same RF input signal can be applied at each of the inputs 220-224. In this condition, the amplifier stages 210-214 amplify the RF input signal and provide an amplified output signal at the output 226. The operating supply voltage of the stacked amplifier 200 can be relatively high, such as between 50-150V, or higher. When implemented on a semiconductor die, the total power handling capacity of the stacked amplifier 200 can be between 400 W-600 W, as one example, depending on the number of amplifier stages, the size of the die, the layout density on the die, and other factors. As particular examples, the power handling capacity of the stacked amplifier 200 can be 400 W, 450 W, 500 W, 550 W, 600 W, or higher. The total power handling capacity of the stacked amplifier 200 is not limited to any particular range, however. Several stacked amplifiers similar to the stacked amplifier 200, each formed and integrated on a separate semiconductor die, can also be arranged together in a single semiconductor package, to reach even higher power ratings. Examples of packaging several stacked amplifiers together in a single semiconductor package are described below with reference to FIG. 13.

Turning to other aspects, FIG. 9 illustrates an example semiconductor die layout 300 for the stacked amplifier 200. The layout 300 is provided as a representative example of how the stacked amplifier 200 shown in FIG. 8 can be arranged on a semiconductor die 301. The illustration in FIG. 9 is not exhaustive, and the layout 300 can include other features that are not illustrated in FIG. 9. Additionally, one or more layout features shown in FIG. 9 can be omitted in some cases. The semiconductor die 301 can include a Si substrate, a Silicon Carbide (SiC) substrate, or another suitable substrate with gallium nitride material formed over the substrate. Transistors and other active devices can be formed in the gallium nitride material. In other cases, the semiconductor die 301 can include a Si substrate, and transistors and other active devices can be formed in the Si substrate. The concepts described herein are not limited to the use of any particular types of substrates or semiconductor materials, however, and can be extended to use with many different types of semiconductor materials.

As shown in FIG. 9, the amplifier stages 210-215 are positioned or stacked in a side-by-side arrangement, from left to right on the page. The transistors 22 and 24 of the amplifier stage 210 are also positioned in a side-by-side arrangement, from bottom to top on the page. The biasing network 240 is positioned to the left of the amplifier stage 210, and a similar biasing network 270 is positioned to the right of the amplifier stage 215. The bias interconnect feed line 260 extends across the layout 300, from the biasing network 240 to the biasing network 270, and separates the transistors 22 and 24 from each other.

When implemented on the semiconductor die 301, the total power handling capacity of the stacked amplifier 200 can be between 400 W-600 W, as one example, depending on the size of the die 301, the layout density on the die 301 (e.g., number and dimensions of the amplifier stages 210-215), and other factors. The semiconductor die 301 can be connected in parallel in one device package with additional die including more stacked amplifiers, to achieve greater power handling.

FIG. 9 also illustrates a number of bond pads around the periphery of the layout 300. The inputs 220-225 for the amplifier stages 210-215 are illustrated as bond pads in FIG. 9. The inputs 220-225 are electrically separated by the separation resistors 230-234. The output 226 for the amplifier stages 210-215 is also illustrated as a bond pad. Separation resistors are not incorporated between the respective outputs of the amplifier stages 210-215 and the bond pad for the output 226 in the example shown in FIG. 9. Instead, all the outputs of the amplifier stages 210-215 are directly coupled to the bond pad for the output 226.

The stitch pads 227 and 228 are also illustrated as bond pads at the left side of the layout 300 in FIG. 9. The stitch resistor 237 separates the stitch pad 227 from the bond pad for the input 220. Similarly, the stitch resistor 238 separates the stitch pad 228 from the bond pad for the output 226. At the right side, the layout 300 also includes stitch pads 227A and 228A, which are similar to the stitch pads 227 and 228. The stitch pads 227, 228, 227A, and 228A can be used to electrically couple the semiconductor die 301 to one or two other semiconductor die(s) including stacked amplifiers similar to the stacked amplifier 200. The other semiconductor dies can be positioned side-by-side with the semiconductor die 301 in a device package. Bond wires can be used to couple the stitch pads 227, 228, 227A, and 228A to similar stitch pads on the other semiconductor dies. Examples of packaging several stacked amplifiers together in a single semiconductor device package are described below with reference to FIG. 13.

Figure 10:
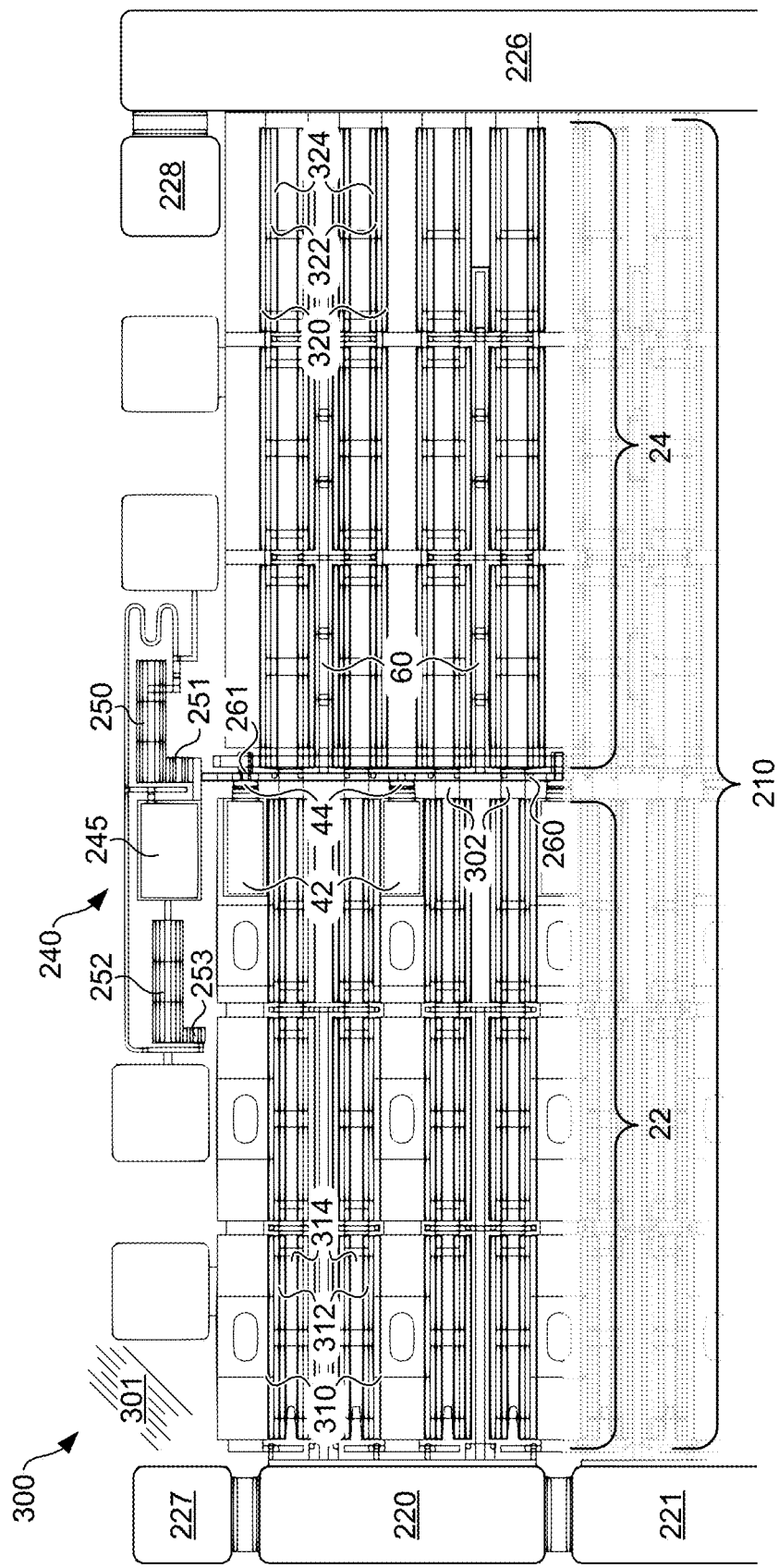
FIG. 10 illustrates an area of the layout shown in FIG. 9 according to various examples described herein.
Figure 11:
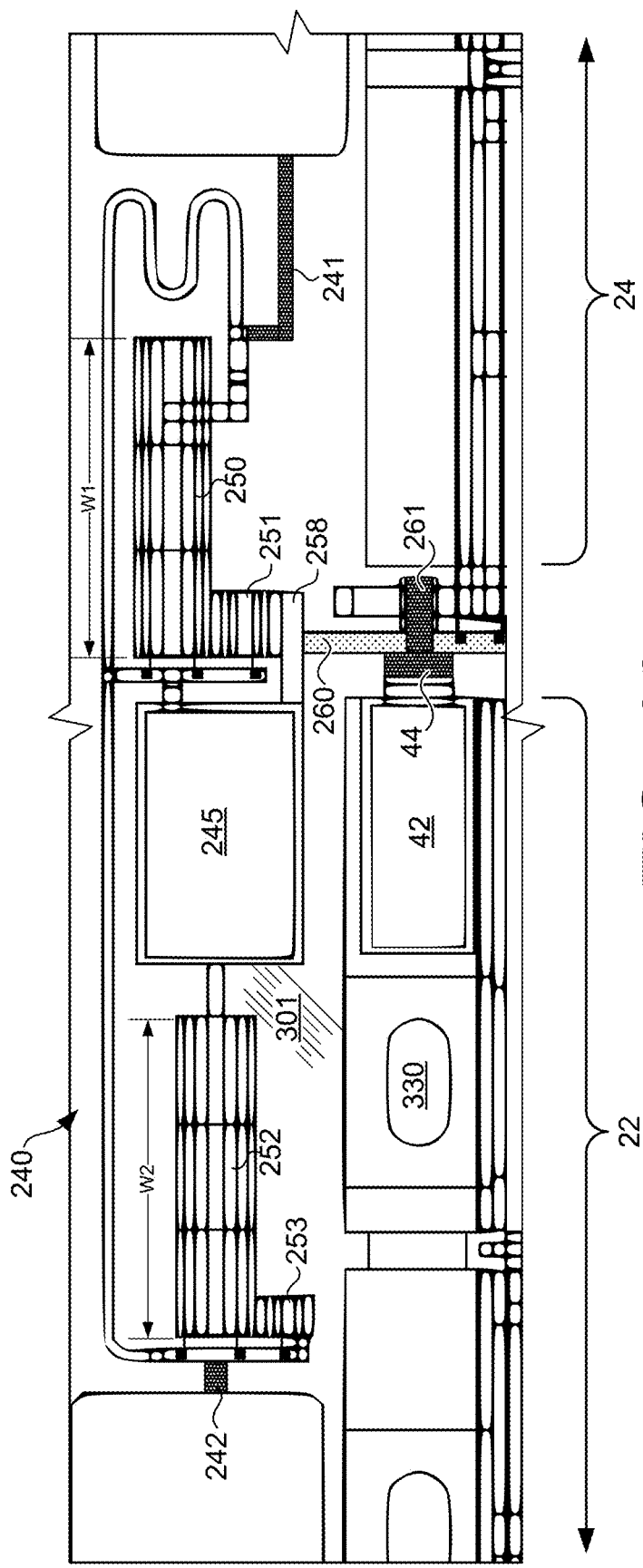
FIG. 11 illustrates an expanded view of an area shown in FIG. 10 according to various examples described herein.
Figure 12:
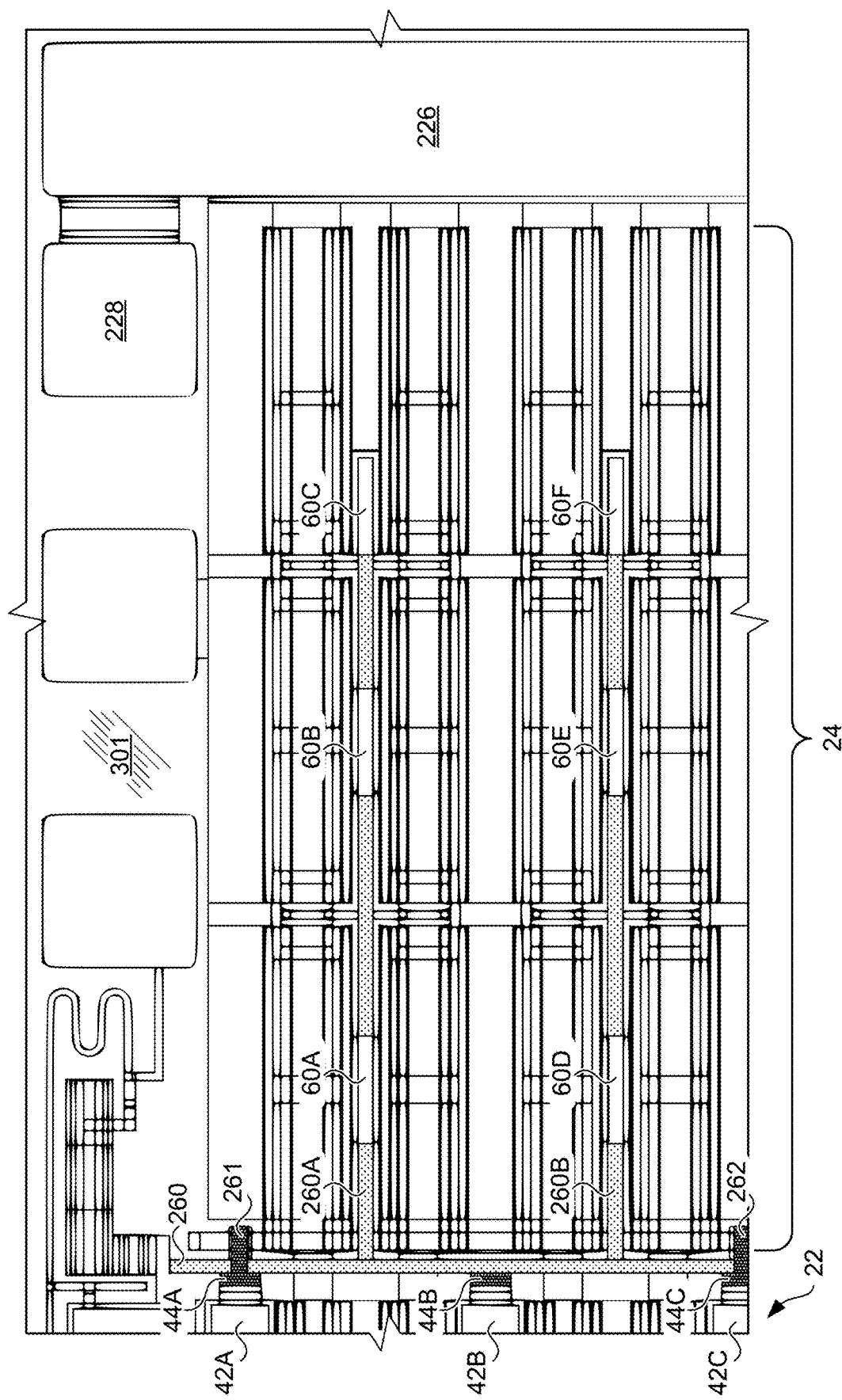
FIG. 12 illustrates another expanded view of an area shown in FIG. 10 according to various examples described herein.

FIG. 10 illustrates an area of the layout 300 shown in FIG. 9 according to various examples described herein. The features of the layout 300 shown in FIG. 10, and in FIGS. 11 and 12, are representative and are not drawn to scale. The individual features described below can vary in size and shape as compared to those shown, without departing from the concepts and advantages of the embodiments.

From left to right on the page, the bond pad for the input 220 is electrically coupled to the gate of the transistor 22. The transistor 22 is positioned in a side-by-side arrangement with the transistor 24, with the bias interconnect feed line 260 extending between and separating the transistors 22 and 24. The biasing network 240 is centrally located above the transistors 22 and 24. A number of metal interconnects 302 extend from a drain of the transistor 22, over (or under) the bias interconnect feed line 260, to the source of the transistor 24. The drain of the transistor 24 is electrically coupled to the bond pad for the output 226.

As also shown in FIG. 10, the layout of the transistor 22 includes interdigitated source features 310, gate features 312, and drain features 314. The source features 310, gate features 312, and drain features 314 extend in multiple rows in the layout 300. Although not individually visible in FIG. 10, the source features 310 can include source contacts on the top surface of the semiconductor die 301, where source metal features (e.g., a source metal layer, a source field plate, or part of a source field plate, etc.) contact the surface of the semiconductor die 301 in a source region of the transistor 22. The gate features 312 can include gate contacts on the top surface of the semiconductor die 301, where gate metal features (e.g., a gate metal layer, a gate field plate, or part of a gate field plate, etc.) contact the surface of the semiconductor die 301 in a gate region of the transistor 22. The drain features 314 can include drain contacts on the top surface of the semiconductor die 301, where drain metal features (e.g., a drain metal layer, a drain field plate, or part of a drain field plate, etc.) contact the surface of the semiconductor die 301 in a drain region of the transistor 22.

The layout of the transistor 24 includes interdigitated drain features 320, gate features 312, and source features 324. The drain features 320, gate features 312, and source features 324 extend in multiple rows in the layout 300. Although not individually visible in FIG. 10, the drain features 320 can include drain contacts on the top surface of the semiconductor die 301, where drain metal features (e.g., a drain metal layer, a drain field plate, or part of a drain field plate, etc.) contact the surface of the semiconductor die 301 in a drain region of the transistor 24. The gate features 322 can include gate contacts on the top surface of the semiconductor die 301, where gate metal features (e.g., a gate metal layer, a gate field plate, or part of a gate field plate, etc.) contact the surface of the semiconductor die 301 in a gate region of the transistor 24. The source features 324 can include source contacts on the top surface of the semiconductor die 301, where source metal features (e.g., a source metal layer, a source field plate, or part of a source field plate, etc.) contact the surface of the semiconductor die 301 in a source region of the transistor 24.

Other components of the stacked amplifier 200 are also illustrated in the layout 300. Particularly, the capacitor 42 and the resistor 44, which are coupled between the gate of the transistor 24 and ground, are shown. Further, the stability capacitor 60, which is coupled between the drain and the gate of the transistor 24, is shown. As described in further detail below, the capacitor 42, the resistor 44, and the stability capacitor 60 are each distributed among (and between) various features of the transistors 22 and 24 in the layout 300.

FIG. 11 is an expanded view of an area shown in FIG. 10. FIG. 11 includes an illustration of the biasing network 240. The biasing network 240 provides a bias voltage on the bias node 258, which is coupled along the bias interconnect feed line 260 to the transistor 24, among others, through the separation resistor 261. Among other components, the biasing network 240 includes resistors 241 and 242 arranged in a voltage divider, transistors 250-253, and a capacitor 245. The biasing network 240 is designed for operation with higher operating supply voltages, such as operating supply voltages between about 80V-150V, or greater. With higher operating supply voltages, the junction temperatures of the transistors 250-253 can become a concern, and the transistors 250-253 are designed to account for and avoid damaging junction temperatures.

The transistors 250 and 251 are connected as common drain or source followers, and the transistors 252 and 253 are connected as current sources. During operation, the current flowing through the transistor 250 is the same as the current flowing through the transistor 251, and current flowing through the transistor 252 is the same as the current flowing through the transistor 253. Also, close to half of the total operating supply voltage for the biasing network 240 is dropped across the transistors 250 and 251, and close to half of the voltage is dropped across the transistors 252 and 253.

However, the voltage drop among the transistors 250 and 251 is not necessarily balanced or equal. The voltage drop across the transistor 250 is higher than the voltage drop across the transistor 251, because the drain-to-source voltage across the transistor 251 is approximately the pinch-off voltage of the transistor 251. The bulk (and balance) of the voltage is dropped across the transistor 250. Similarly, the voltage drop among the transistors 252 and 253 is not necessarily balanced or equal. The voltage drop across the transistor 252 is higher than the voltage drop across the transistor 253, because the drain-to-source voltage across the transistor 253 is approximately the pinch-off voltage of the transistor 253. The bulk (and balance) of the voltage across is dropped across the transistor 252. Thus, the transistors 250 and 252 handle more power than the transistors 251 and 253, and the junction temperatures of the transistors 250 and 252 are of a larger concern.

To account for the operational concern identified above, the size of the transistor 250 (e.g., measured for the gate width "W1" of all gate fingers in the transistor 250) is larger than the size of the transistor 251. Similarly, the size of the transistor 252 (e.g., measured for the gate width "W2" of all gate fingers in the transistor 252) is larger than the size of the transistor 253. Thus, the current density in the transistor 251 is larger than the current density in the transistor 250, and the current density in the transistor 253 is larger than the current density in the transistor 252. The junction temperatures of the transistors 250-253 are still maintained to within suitable operating parameters, because the total power handling of each of the transistors 250-253 is balanced, respectively, with its size.

As noted above, the biasing network 240 provides a bias voltage on the bias node 258. The bias voltage is coupled along the bias interconnect feed line 260 to the transistor 24, among others. A number of resistors are coupled to or inserted, inline along the bias interconnect feed line 260, as part of the layout 300. For example, the separation resistor 261 is inserted, inline along the bias interconnect feed line 260. Although out of view in FIG. 11, the other separation resistors 262-264 (see FIG. 8) are also inserted along the bias interconnect feed line 260 between the amplifier stages 210-215.

Additionally, the resistor 44 is coupled along the bias interconnect feed line 260, between the bias interconnect feed line 260 and the capacitor 42. The capacitor 42 and the resistor 44 are components of the stabilization network 40, which is coupled between the gate of the transistor 24 and ground (see FIGS. 5 and 8). In the layout 300, although the bias interconnect feed line 260 separates the transistors 22 and 24 (and particularly separates the contacts of those transistors), the stabilization network 40 for the transistor 24 is coupled from the gate of the transistor 24, across the bias interconnect feed line 260, to features of the transistor 22.

As shown in FIG. 11, the capacitor 42 is positioned and integrated in part with a source metal feature of the transistor 22. The source of the transistor 22 is coupled to ground through the in-source vias 330. The in-source vias 330 pass through the semiconductor die 301 and electrically couple a source metal layer of the transistor 22, on a top side of the semiconductor die 301, to a metal ground plane on a back side of the semiconductor die 301.

The capacitor 42 is formed as a metal-insulator-metal (MIM) capacitor over the semiconductor die 301, with a bottom metal layer, a dielectric layer over the bottom metal layer, and the source metal layer over the dielectric layer. As examples, the dielectric layer of the capacitor 42 can be silicon nitride ($Si_3N_4$), silicon dioxide, tantalum pentoxide ($Ta_2O_5$), silicon oxynitride ($SiO_xN_y$), or other suitable dielectric materials. The source metal layer of the transistor 22 is electrically coupled to the ground metal plane on the back side of the semiconductor die 301 by the in-source vias 330. Referring back to FIG. 10, the resistor 44 is shown to be distributed, in a number of separated resistive elements, along the bias interconnect feed line 260. The capacitor 42 is also shown to be distributed among the source features 310 of the transistor 22.

The resistor 44, the separation resistor 261, and other resistors formed on the semiconductor die 301 can be formed using nichrome, tantalum nitride, tungsten silicide, or other suitable materials. The resistors can also be formed as bulk resistors, through implanted or diffused dopants, or in other ways. The placement of the resistor 44 and the separation resistor 261, among others, with the bias interconnect feed line 260 provides a compact and efficient way to integrate the components of the amplifier stage 210 in the layout 300. Similarly, the arrangement of the capacitor 42 with the source metal layer of the transistor 22 also provides a compact and efficient way to integrate the components of the amplifier stage 210 in the layout 300.

FIG. 12 is another expanded view of an area shown in FIG. 10. FIG. 12 illustrates the separation resistors 261 and 262 inserted inline along the bias interconnect feed line 260. The distributed nature of the resistor 44 is also shown in FIG. 12, as the resistor 44 is formed by resistors 44A-44C. Similarly, the distributed nature of the capacitor 42 is also shown in FIG. 12, as the capacitor 42 is formed by the capacitors 42A-42C.

Additional features of the bias interconnect feed line 260 are also shown in FIG. 12. Particularly, the bias interconnect feed line 260 is also coupled to the bias feed line fingers 260A and 260B, which run laterally, in the same direction as the channel width of the transistor 24, among the contacts of the transistor 24. The distributed nature of the stability capacitor 60 (see FIG. 8) is also shown in FIG. 12, as the capacitor 60 is formed by the capacitors 60A-60F.

The capacitors 60A-60C are formed by the bias feed line finger 260A as a layer of metal on one aide, a dielectric layer over the bias feed line finger 260A, and another metal layer over the dielectric layer, which is coupled to the drain of the transistor 24 and the bond pad for the output 226. The capacitors 60D-60F are formed by the bias feed line finger 260B as a layer of metal on one aide, a dielectric layer over the bias feed line finger 260C, and another metal layer over the dielectric layer, which is coupled to the drain of the transistor 24 and the bond pad for the output 226. Thus, the stability capacitor 60 is formed over the semiconductor die 301 among a plurality of contacts of the transistor 24. The distributed placement of the stability capacitor 60 among a plurality of contacts of the transistor 24 provides a compact and efficient way to integrate the components of the amplifier stage 210 in the layout 300.

Figure 13:
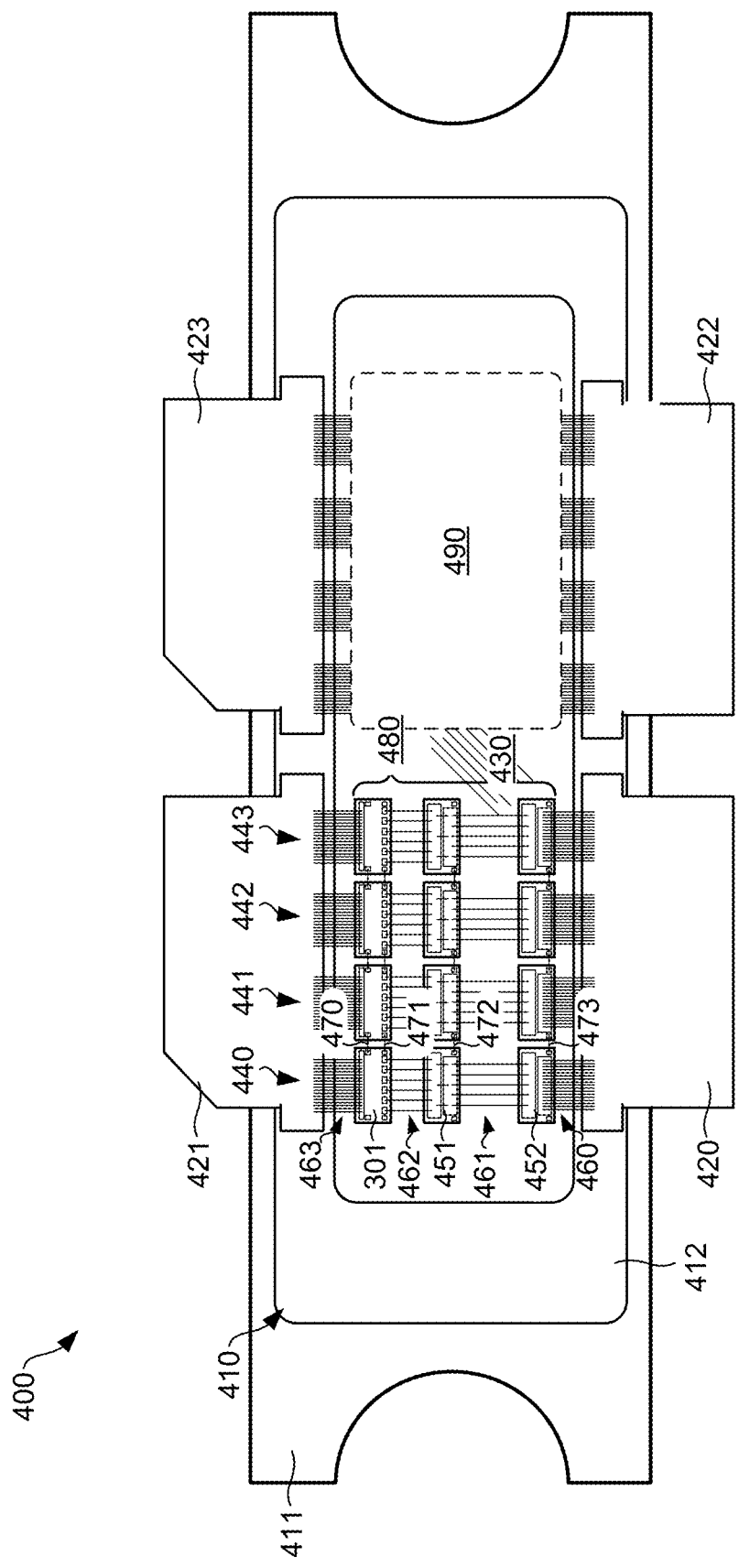
FIG. 13 illustrates a packaged amplifier device according to various examples described herein.

FIG. 13 illustrates a packaged amplifier device 400 according to various examples described herein. The illustration of the packaged amplifier device 400 in FIG. 13 is representative and not drawn to scale. The individual features described below can vary in size and shape as compared to that shown, without departing from the embodiments. The packaged amplifier device 400 includes a number of semiconductor die secured within a semiconductor package 410. The semiconductor package 410 can be embodied as a ceramic air cavity package, a polymer overmold air cavity package, or a similar air cavity package. The device packaging concepts described below are not limited to use with any particular type of semiconductor package, however, and other types of packages can be used.

The semiconductor package 410 includes a conductive flange 411, a frame 412, and leads 420-422. The leads 420-422 are conductive and can be used for input and output signals. The conductive flange 411 can be formed from copper, molybdenum, a laminate of copper and molybdenum, or other material(s) with suitable conductive and thermal properties. The conductive flange 411 can be secured to a printed circuit board or other area for connection to a larger circuit, using solder, screws, or other fasteners. Being conductive, the conductive flange 411 can be considered another lead of the semiconductor package 410, and it is typically relied upon as a ground lead. The conductive flange 411 can include eyelets for use with fasteners, as shown in FIG. 13. The eyelets can be omitted in other cases, such as if solder is used to secure the conductive flange 411 to a printed circuit board or other substrate.

The frame 412 surrounds an air cavity within the semiconductor package 410, and a top surface 430 of the conductive flange 411 is exposed within the frame 412. A number of columns 440-443 of semiconductor die are secured to the top surface 430 of the conductive flange 411 within the frame 412. As shown in FIG. 13, the column 440 includes the semiconductor die 301 (see also FIG. 9) and the semiconductor die 451 and 452. The semiconductor die 301, 451, and 452, among the others in the columns 441-443, can each be secured to the top surface 430 using thermal epoxy, solder (e.g., gold-tin preforms), a combination thereof, or other suitable means. In one example, the semiconductor die 301 is secured to the top surface 430 using a gold-tin preform solder, and the semiconductor die 451 and 452 are secured to the top surface 430 using thermal epoxy.

The semiconductor die 301 includes the stacked amplifier 200 described herein. Both the semiconductor die 451 and 452 include one or more capacitors for input impedance matching. In some cases, one or both of the semiconductor die 451 and 452 can also include resistors to form resistor-capacitor networks for input impedance matching. Together, the semiconductor die 451 and 452 can be relied upon for first- and second-harmonic termination, control, and input impedance matching for the stacked amplifier 200. Depending on the needs for input impedance matching, the semiconductor die 451 can be omitted, the semiconductor die 452 can be omitted, or both the semiconductor die 451 and 452 can be omitted.

The each of the columns 441-443 also includes a semiconductor die similar to the semiconductor die 301, 451, and 452. The columns 443-443 are coupled in parallel with each other, between the input lead 420 and the output lead 421. Thus, the packaged amplifier device 400 includes four (4) stacked amplifiers among the columns 440-443, including the stacked amplifier 200 on the semiconductor die 301 and three additional stacked amplifiers that can be similar (i.e., matched in size, active devices, active device proportions, etc.) to the stacked amplifier 200.

After the group of semiconductor die 480 are secured in the semiconductor package 410, the die are electrically coupled to the input lead 420, to each other, and to the output lead 421 as shown in FIG. 13. Particularly, the bond wires 460 are coupled between the input lead 420 and bond pads on the semiconductor die 452. The bond wires 461 are coupled between bond pads on the semiconductor die 452 and bond pads on the semiconductor die 451. The bond wires 462 are coupled between bond pads on the semiconductor die 451 and bond pads on the semiconductor die 301. Additionally, the bond wires 463 are coupled between bond pads on the semiconductor die 301 and the output lead 421. From the die 451, the bond wires 462 are coupled to the bond pads for the inputs 220-225 of the stacked amplifier 200 (see FIG. 9). The bond wires 463 are coupled from the bond pads for the output 226 of the stacked amplifier 200 to the output lead 421. Any suitable type and number of bond wires can be used, such as gold bond wires of 1.5 mils in thickness.

Additional bond wires can also be used to electrically couple the semiconductor die 301, 451, and 452 in the column 440 with corresponding semiconductor die in the column 441. For example, the bond wire 470 can be coupled between the stitch pad 228A (see FIG. 9) on the semiconductor die 301 and a similar stitch pad on the die to the right in FIG. 13. Similarly, the bond wire 471 can be coupled between the stitch pad 227A (see FIG. 9) on the semiconductor die 301 and a similar stitch pad on the die to the right in FIG. 13. The bond wire 472 can be coupled between a stitch pad on the semiconductor die 451 and a similar stitch pad on the die to the right in FIG. 13. Additionally, the bond wire 473 can be coupled between a stitch pad on the semiconductor die 452 and a similar stitch pad on the die to the right in FIG. 13. Additional bond wires can also be used to couple the semiconductor die in the column 441 with those in the column 442, and to couple the semiconductor die in the column 442 with those in the column 443. In that way, the respective potentials at certain circuit nodes among the group of semiconductor die 480 can be matched and referenced with each other, helping to maintain the stability of the packaged amplifier device 400.

From the perspective of the packaged amplifier device 400 as a whole, the group of semiconductor die 480 operate collectively as a single three-terminal active device. Particularly, the die 480 operate as a single common source transistor amplifier, with the input lead 420 acting as a gate input, the output lead 421 acting as a drain output, and the flange 411 acting as the common source. The packaged amplifier device 400 can also include a group of semiconductor die 490 similar to the die 480, but electrically coupled between the input lead 422, the output lead 423, and the flange 411. Together, the group of semiconductor die 490 can also operate collectively as another, single three-terminal active device of the packaged amplifier device 400. The die 480 and the die 490 can be used together to form a D-mode amplifier in some cases, although other circuit configurations can be used.

In other cases, the packaged amplifier device 400 can omit the group of semiconductor die 490, the input lead 422, and the output lead 423. In that case, the packaged amplifier device 400 can appear as a single three-terminal active device having or consisting of only three terminals or package leads. In still other cases the packaged amplifier device 400 can include additional columns of semiconductor die coupled together in the group of semiconductor die 480, the group of semiconductor die 490, or both. Further, the packaged amplifier device 400 can include additional leads and additional groups of die, and other variations are within the scope of the embodiments.

A ceramic, polymer, or other lid (not shown) can be placed over or into the frame 412 after the all the semiconductor die have been secured in place and wire bonded, and the lid can be secured or sealed in place using adhesives, bonds, or other means. In some cases, the lid can be hermetically sealed to the frame 412, and the semiconductor package 410 can be a hermetically sealed package.

The packaged amplifier device 400 provides a solution for a high voltage stacked transistor amplifier, without the need for off-chip components, like biasing networks of resistors and inductors. The packaged amplifier device 400 is also capable of operating at high supply voltages, by design, without sacrificing reliability or performance. The packaged amplifier device 400 includes the stacked amplifier 200 on the semiconductor die 301, along with as many as seven additional similar amplifiers in the example shown in FIG. 13. Additional stacked amplifiers can be combined in parallel, using larger packages. Thus, the total power handling capacity of the packaged amplifier device 400 can reach 2,000-4,000 W or more. Particular examples of the total power handling capacity of the packaged amplifier device 400 can be 2,000 W, 2,500 W, 3,000 W, 3,500 W, 4,000 W, or higher, although lower power handling capacities are also possible using fewer stacked amplifiers.

The amplifier stages and stacked amplifiers described herein, among others consistent with the concepts described herein, can be simulated as a number of circuit elements in software. For example, the amplifier stages 10, 50, 70, 90, 90A, 100, or 100A can be simulated on one or more computing devices. Similarly, the stacked amplifier 200 can be simulated on one or more computing devices. One or more aspects of a semiconductor manufacturing process, such as the dopant distribution, the stress distribution, the device geometry, and other aspects of the manufacturing process used to form the amplifiers can be simulated. Manufacturing process simulations can be relied upon to model one or more individual operating characteristics of the transistors and other elements (e.g., resistors, inductors, capacitors, etc.) of the amplifiers.

One or more operational characteristics of the amplifiers, such as the gain-bandwidth, the stability, the noise figure (NF), and other characteristics can also be simulated. Simulations can be relied upon to model the characteristics of the semiconductor devices (e.g., transistors) and other elements (e.g., resistors, inductors, capacitors, etc.) of the amplifiers. Thus, the amplifiers can be simulated using one or more circuit simulator, semiconductor device modeling, semiconductor process simulation, or related Technology Computer Aided Design (TCAD) software tools.

When simulated using software, each circuit element can be embodied as a module or listing of code associated with certain parameters to simulate the element. The software to simulate the circuit elements can include program instructions embodied in the form of, for example, source code that includes human-readable statements written in a programming language or machine code that includes machine instructions recognizable by a suitable execution system, such as a processor in a computer system or other system. If embodied in hardware, each element can represent a circuit or a number of electrically interconnected circuits.

One or more computing devices can execute the software to simulate the circuit elements that form the distributed amplifiers described herein, among others. The computing devices can include at least one processing circuit. Such a processing circuit can include, for example, one or more processors and one or more storage or memory devices coupled to a local interface. The local interface can include, for example, a data bus with an accompanying address/control bus or any other suitable bus structure.

The storage or memory devices can store data or components that are executable by the processors of the processing circuit. For example, data associated with one or more circuit elements of the distributed amplifiers can be stored in one or more storage devices and referenced for processing by one or more processors in the computing devices. Similarly, the software to simulate the circuit elements and/or other components can be stored in one or more storage devices and be executable by one or more processors in the computing devices.

The transistors described herein can include one or more field plates, such as source-connected field plates, gate-connected field plates, or both source-connected and gate-connected field plates. Although FET transistors are described above, the concepts described herein can be applied to bipolar junction transistors, and the amplifier cells described herein can be embodied using bipolar junction transistors. Among other types of FET transistors, the transistors described herein can be formed as high electron mobility transistors (HEMTs), pseudomorphic high-electron mobility transistors (pHEMTs), metamorphic high-electron mobility transistors (mHEMTs), and laterally diffused metal oxide semiconductor transistors (LDMOS) for use as high efficiency power amplifiers.

The transistors described herein can be formed using a number of different semiconductor materials and semiconductor manufacturing processes. Example semiconductor materials include the group IV elemental semiconductor materials, including Silicon (Si) and Germanium (Ge), compounds thereof, and the group III elemental semiconductor materials, including Aluminum (Al), Gallium (Ga), and Indium (In), and compounds thereof. Semiconductor transistor amplifiers can be constructed from group III-V direct bandgap semiconductor technologies, in certain cases, as the higher bandgaps and electron mobility provided by those devices can lead to higher electron velocity and breakdown voltages, among other benefits. Thus, in some examples, the concepts can be applied to group III-V direct bandgap active semiconductor devices, such as the III-Nitrides (Aluminum (Al)-, Gallium (Ga)-, Indium (In)-, and their alloys (AlGaIn) based Nitrides), GaAs, InP, InGaP, AlGaAs, etc. devices. However, the principles and concepts can also be applied to transistors and other active devices formed from other semiconductor materials.

The concepts described herein can be embodied by GaN-on-Si transistors and devices, GaN-on-SiC transistors and devices, as well as other types of semiconductor materials. As used herein, the phrase "gallium nitride material" or GaN semiconductor material refers to gallium nitride and any of its alloys, such as aluminum gallium nitride ($Al_x Ga_{(1-x)}N$), indium gallium nitride ($In_y Ga_{(1-y)} N$), aluminum indium gallium nitride ($Al_x In_y Ga_{(1-x-y)} N$), gallium arsenide phosphide nitride ($GaAs_a P_b N_{(1-a-b)}$), aluminum indium gallium arsenide phosphide nitride ($Al_x In_y Ga_{(1-x-y)} As_a P_b N_{(1-a-b)}$), among others. Typically, when present, arsenic and/or phosphorous are at low concentrations (e.g., less than 5 weight percent). The term "gallium nitride" or GaN semiconductor refers directly to gallium nitride, exclusive of its alloys.

The features, structures, or characteristics described above may be combined in one or more embodiments in any suitable manner, and the features discussed in the various embodiments are interchangeable, if possible. In the foregoing description, numerous specific details are provided in order to fully understand the embodiments of the present disclosure. However, a person skilled in the art will appreciate that the technical solution of the present disclosure may be practiced without one or more of the specific details, or other methods, components, materials, and the like may be employed. In other instances, well-known structures, materials, or operations are not shown or described in detail to avoid obscuring aspects of the present disclosure.

Although relative terms such as "on," "below," "upper," "lower," "top," "bottom," "right," and "left" may be used to describe the relative spatial relationships of certain structural features, these terms are used for convenience only, as a direction in the examples. It should be understood that if the device is turned upside down, the "upper" component will become a "lower" component. When a structure or feature is described as being "on" (or formed on) another structure or feature, the structure can be positioned directly on (i.e., contacting) the other structure, without any other structures or features intervening between the structure and the other structure. When a structure or feature is described as being "over" (or formed over) another structure or feature, the structure can be positioned over the other structure, with or without other structures or features intervening between them. When two components are described as being "coupled to" each other, the components can be electrically coupled to each other, with or without other components being electrically coupled and intervening between them. When two components are described as being "directly coupled to" each other, the components can be electrically coupled to each other, without other components being electrically coupled between them.

Terms such as "a," "an," "the," and "said" are used to indicate the presence of one or more elements and components. The terms "comprise," "include," "have," "contain," and their variants are used to be open ended and may include or encompass additional elements, components, etc., in addition to the listed elements, components, etc., unless otherwise specified. The terms "first," "second," etc. are used only as labels, rather than a limitation for a number of the objects.

Although embodiments have been described herein in detail, the descriptions are by way of example. The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be accorded the broadest interpretation so as to encompass modifications and equivalent structures.

Therefore, the following is claimed:

1. An amplifier, comprising:
an amplifier cell, the amplifier cell comprising a common source transistor and a common gate transistor in a cascode arrangement, at least one of the common source transistor and the common gate transistor comprising a field plate;
a second amplifier cell, the second amplifier cell comprising a second common source transistor and a second common gate transistor in a cascode arrangement; and
a biasing network coupled at a source of the common gate transistor of the amplifier cell and comprising a bias node, the bias node being coupled to the gate of the common gate transistor of the amplifier cell and to the gate of the second common gate transistor of the second amplifier cell.

2. The amplifier of claim 1, further comprising a stability capacitor directly coupled between an output for the amplifier and a gate of the common gate transistor.

3. The amplifier of claim 2 wherein a capacitance of the stability capacitor maintains a positive real output impedance for the amplifier over an operating frequency for the amplifier.

4. The amplifier of claim 1, wherein a gate of the common gate transistor is coupled to the biasing node of the biasing network.

5. The amplifier of claim 1, wherein the biasing network comprises a resistor voltage divider network coupled between an output for the amplifier, the amplifier cell, and a ground for the amplifier.

6. The amplifier of claim 5, wherein:
the biasing node is positioned along the resistor voltage divider network; and
a gate of the common gate transistor is coupled to the biasing node.

7. The amplifier of claim 5, wherein the biasing network further comprises an inductor coupled in series with the resistor voltage divider network.

8. An amplifier, comprising:
an amplifier cell, the amplifier cell comprising a common source transistor and a common gate transistor in a cascode arrangement, at least one of the common source transistor and the common gate transistor comprising a field plate; and
a biasing network coupled to the common gate transistor of the amplifier cell, wherein:
the biasing network comprises a resistor voltage divider network coupled between an output for the amplifier, the amplifier cell, and a ground for the amplifier;
the biasing network further comprises a supply transistor;
a gate of the supply transistor is coupled to a biasing node along the resistor voltage divider network; and
a gate of the common gate transistor is coupled to a source of the supply transistor.

9. The amplifier of claim 1, wherein a drain of the common source transistor is electrically coupled to a source of the common gate transistor in the cascode arrangement.

10. The amplifier of claim 1, wherein the amplifier cell further comprises a second common gate transistor.

11. The amplifier of claim 1, wherein:
the amplifier cell further comprises a resistor-capacitor network coupled between a gate of the common gate transistor and a ground for the amplifier; and
the resistor-capacitor network provides a radio-frequency ground at the gate of the common gate transistor.

12. The amplifier of claim 1, further comprising a stability resistor coupled between the amplifier cell and the biasing network.

13. The amplifier of claim 1, wherein a power handling capacity of the amplifier is greater than 400 W.

14. The amplifier of claim 1, wherein an operating supply voltage for the amplifier is greater than 50 V.

15. The amplifier of claim 1, wherein:
with respect to an output of the amplifier, the second amplifier cell is arranged in parallel with the amplifier cell.

16. The amplifier of claim 15, wherein an output of the amplifier cell is directly coupled to an output of the second amplifier cell.

17. The amplifier of claim 15, further comprising a stability resistor coupled between an input of the amplifier cell and an input of the second amplifier cell.

18. The amplifier of claim 15, further comprising a stability resistor coupled between the second amplifier cell and the biasing network.

19. The amplifier of claim 15, further comprising:
a first stability resistor coupled between the amplifier cell and the biasing network; and
a second stability resistor coupled between the amplifier cell and the second amplifier cell.

20. The amplifier of claim 15, further comprising a second biasing network, wherein a gate of the common gate transistor and a gate of the second common gate transistor are both coupled to the biasing network and the second biasing network.

21. The amplifier of claim 20, further comprising:
a bias interconnect feed line, wherein:
the biasing network is coupled at a first end of the bias interconnect feed line; and
the second biasing network is coupled at a second end of the bias interconnect feed line.

22. The amplifier of claim 21, further comprising:
a stability resistor coupled between the amplifier cell and the biasing network at the first end of the bias interconnect feed line;
a second stability resistor coupled between the amplifier cell and the second amplifier cell along the bias interconnect feed line; and a third stability resistor coupled between the second amplifier cell and the second biasing network at the second end of the bias interconnect feed line.

23. The amplifier of claim 1, further comprising:
a plurality of additional amplifier cells, wherein:
with respect to an output of the amplifier, the second amplifier cell and the plurality of additional amplifier cells are arranged in parallel with the amplifier cell.

24. The amplifier of claim 23, further comprising:
a bias interconnect feed line coupled to the bias node, wherein:
the second amplifier cell and the additional amplifier cells are each coupled to the bias node through the bias interconnect feed line.

25. An amplifier, comprising:
an amplifier cell, the amplifier cell comprising a common source transistor and a common gate transistor in a cascode arrangement;
a second amplifier cell, the second amplifier cell comprising a second common source transistor and a second common gate transistor in a cascode arrangement; and
a biasing network coupled at a source of the common gate transistor of the amplifier cell and comprising a bias node, the bias node being coupled to the gate of the common gate transistor of the amplifier cell and to the gate of the second common gate transistor of the second amplifier cell.

26. The amplifier of claim 25, further comprising a stability capacitor directly coupled between an output for the amplifier and a gate of the common gate transistor.

27. The amplifier of claim 25, wherein the biasing network comprises a resistor voltage divider network coupled between an output for the amplifier, the amplifier cell, and a ground for the amplifier.

28. The amplifier of claim 27, wherein:
the biasing node is positioned along the resistor voltage divider network; and
a gate of the common gate transistor is coupled to the biasing node.

29. The amplifier of claim 27, wherein the biasing network further comprises an inductor coupled in series with the resistor voltage divider network.

30. The amplifier of claim 27, wherein:
the biasing network further comprises a supply transistor;
a gate of the supply transistor is coupled to the biasing node along the resistor voltage divider network; and
a gate of the common gate transistor is coupled to a source of the supply transistor.

31. The amplifier of claim 25, further comprising a resistor-capacitor network coupled between a gate of the common gate transistor and a ground for the amplifier.

32. The amplifier of claim 25, further comprising a stability resistor coupled between the amplifier cell and the biasing network.

33. The amplifier of claim 25, further comprising a stability resistor coupled between an input of the amplifier cell and an input of the second amplifier cell.

34. The amplifier of claim 25, further comprising a second biasing network, wherein a gate of the common gate transistor and a gate of the second common gate transistor are both coupled to the biasing network and the second biasing network.

35. The amplifier of claim 34, further comprising:
a bias interconnect feed line, wherein:
the biasing network is coupled at a first end of the bias interconnect feed line; and
the second biasing network is coupled at a second end of the bias interconnect feed line.

36. The amplifier of claim 35, further comprising:
a stability resistor coupled between the amplifier cell and the biasing network at the first end of the bias interconnect feed line;
a second stability resistor coupled between the amplifier cell and the second amplifier cell along the bias interconnect feed line; and
a third stability resistor coupled between the second amplifier cell and the second biasing network at the second end of the bias interconnect feed line.

37. The amplifier of claim 25, further comprising:
a plurality of additional amplifier cells, wherein:
with respect to an output of the amplifier, the second amplifier cell and the plurality of additional amplifier cells are arranged in parallel with the amplifier cell.

38. The amplifier of claim 37, further comprising:
a bias interconnect feed line coupled to the bias node, wherein:
the second amplifier cell and the additional amplifier cells are each coupled to the bias node through the bias interconnect feed line.

* * * * *